United States Patent
Hayakawa et al.

(10) Patent No.: US 7,274,592 B2
(45) Date of Patent: Sep. 25, 2007

(54) NON-VOLATILE MEMORY AND METHOD OF CONTROLLING THE SAME

(75) Inventors: Yukio Hayakawa, Aizuwakamatsu (JP); Hiroyuki Nansei, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 29 days.

(21) Appl. No.: 11/342,947

(22) Filed: Jan. 30, 2006

(65) Prior Publication Data

US 2006/0267080 A1    Nov. 30, 2006

Related U.S. Application Data

(63) Continuation of application No. PCT/JP2005/001246, filed on Jan. 28, 2005.

(51) Int. Cl.
G11C 16/04    (2006.01)
(52) U.S. Cl. .............................. 365/185.03; 365/185.05
(58) Field of Classification Search ........... 365/185.03, 365/185.05, 185.27; 257/393, E27.06
See application file for complete search history.

(56) References Cited

U.S. PATENT DOCUMENTS

| | | | |
|---|---|---|---|
| 6,091,104 A | 7/2000 | Chen | |
| 6,291,297 B1 | 9/2001 | Chen | |
| 6,531,735 B1 | 3/2003 | Kamigaki et al. | |
| 6,747,310 B2 | 6/2004 | Fan et al. | |
| 6,858,497 B2 * | 2/2005 | Moriya et al. | 438/262 |
| 2002/0074594 A1 | 6/2002 | Katayama et al. | |
| 2003/0017672 A1 | 1/2003 | Katayama et al. | |
| 2003/0155607 A1 | 8/2003 | Kamigaki et al. | |
| 2004/0065918 A1 | 4/2004 | Katayama et al. | |
| 2004/0070026 A1 | 4/2004 | Kamigaki et al. | |
| 2005/0020013 A1 * | 1/2005 | Moriya et al. | 438/262 |

FOREIGN PATENT DOCUMENTS

| | | |
|---|---|---|
| EP | 1 085 519 | 3/2001 |
| EP | 1 288 963 | 3/2003 |
| JP | 2001-156275 | 6/2001 |
| JP | 2002-164449 | 6/2002 |

OTHER PUBLICATIONS

Eitan et al.; "NROM: A Novel Localized Trapping, 2-Bit Nonvolatile Memory Cell"; IEEE Electron Device Letters, vol. 21, No. 11, Nov. 2000.

* cited by examiner

*Primary Examiner*—Vu A. Le
(74) *Attorney, Agent, or Firm*—Ingrassia Fisher & Lorenz, P.C.

(57) ABSTRACT

A single cell that has a gate insulating film formed with an ONO film is provided in a region in which two bit lines cross one word line. The single cell is a four-bit multi-value cell, and has four charge accumulation regions. Two plug-like control electrodes are provided in the region surrounded by the word line and the bit lines. A bias is applied to one of the plug-like control electrodes and the word line so that the portion on the surface of the semiconductor substrate that is located immediately below the word line and corresponds to the location of the bias-applied control electrode is put into an accumulation state or a depletion state. In this manner, the width of the channel is adjusted, and the charge holding state of each of the four charge accumulation regions is controlled through the channel width adjustment.

18 Claims, 24 Drawing Sheets

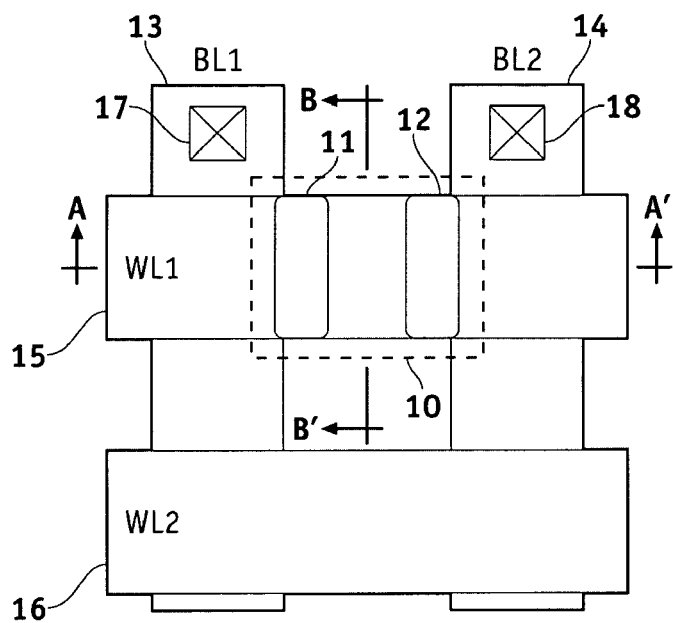
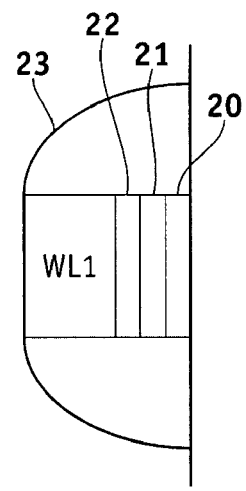
FIG. 1C
PRIOR ART
FIG. 1A
PRIOR ART
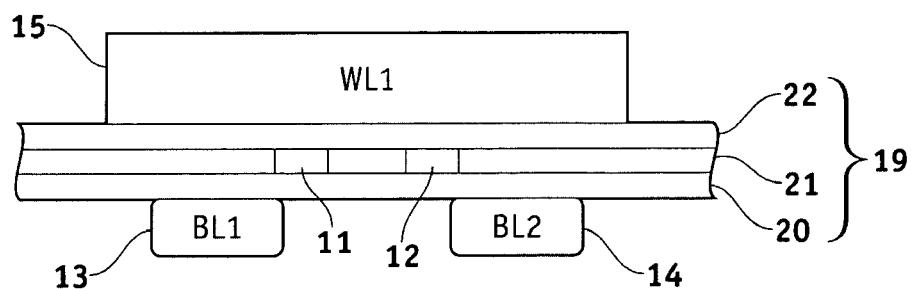
FIG. 1B
PRIOR ART

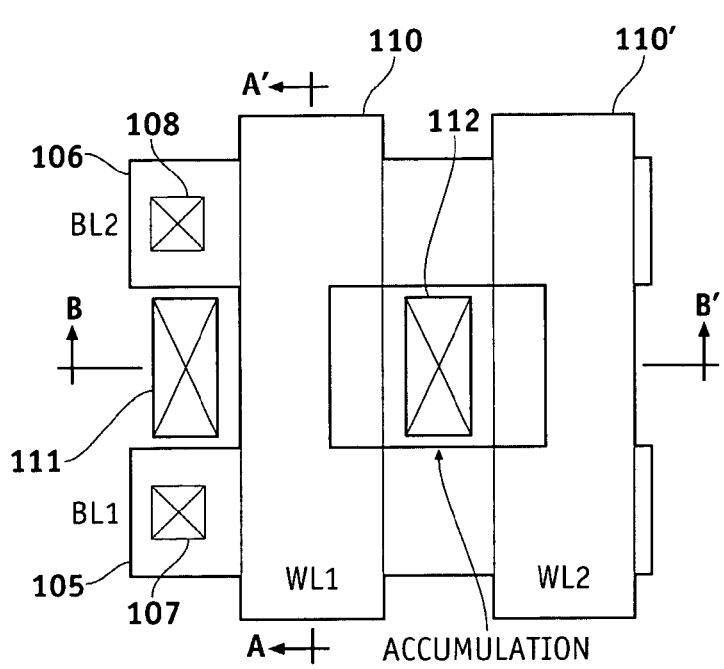
*FIG. 4A*
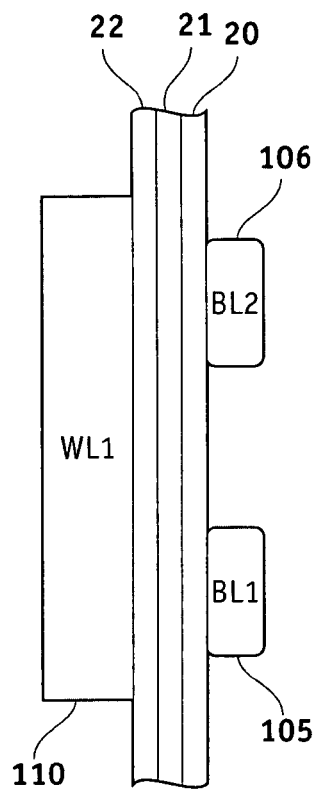
*FIG. 4B*
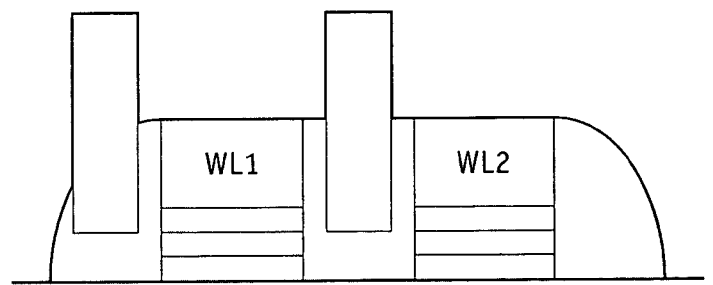
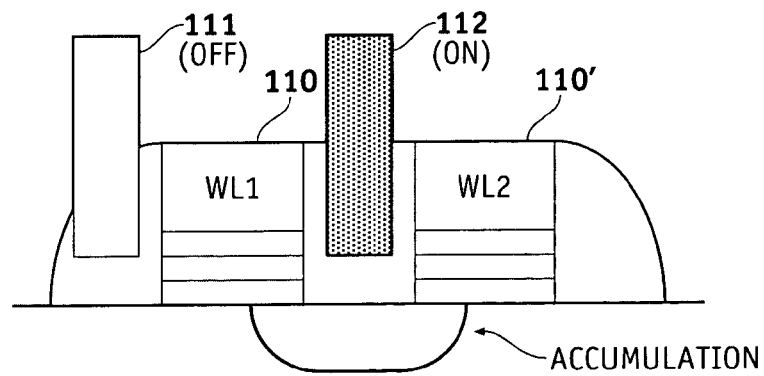
*FIG. 4C*

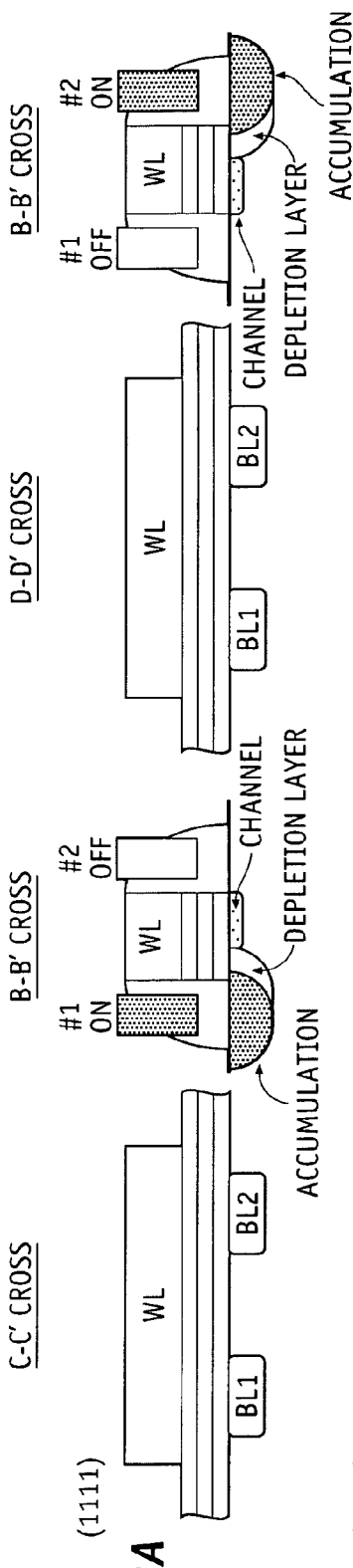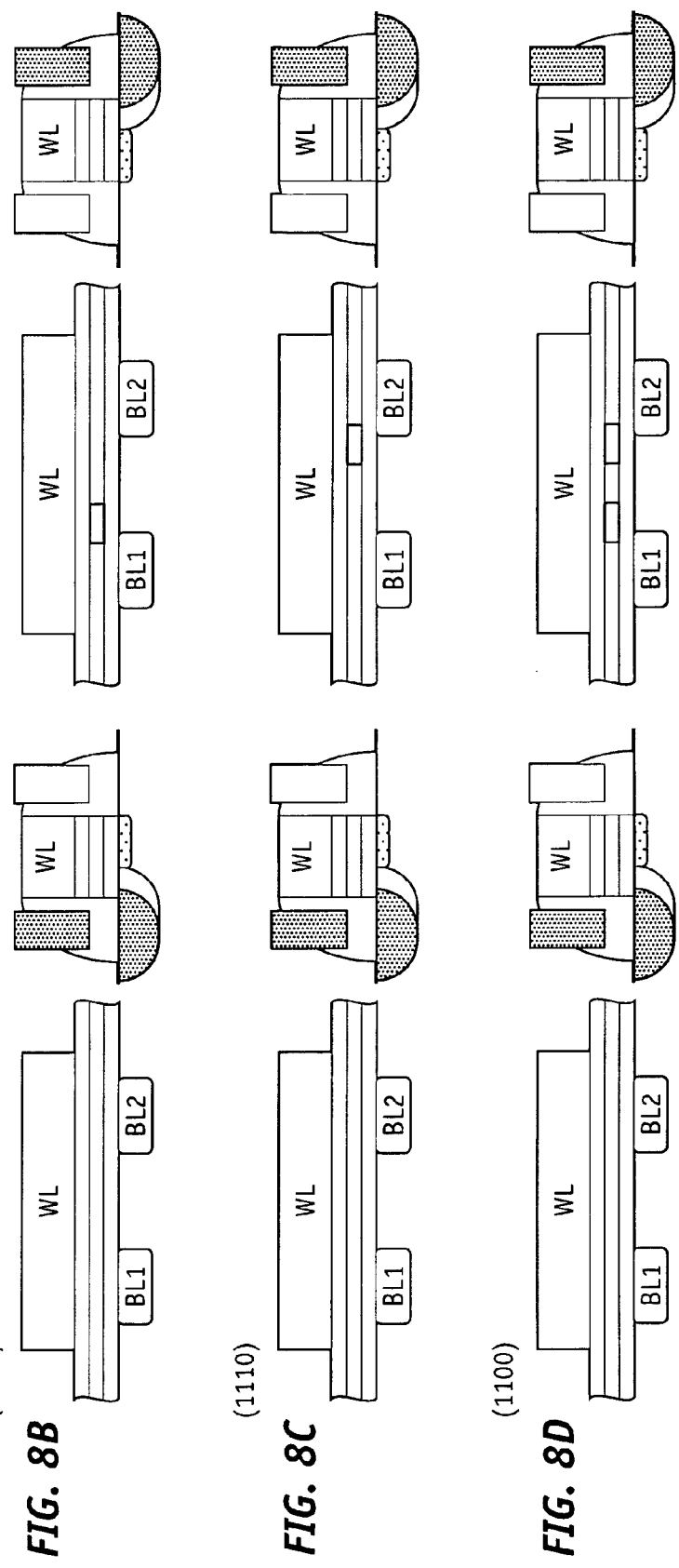
FIG. 8A
FIG. 8B
FIG. 8C
FIG. 8D

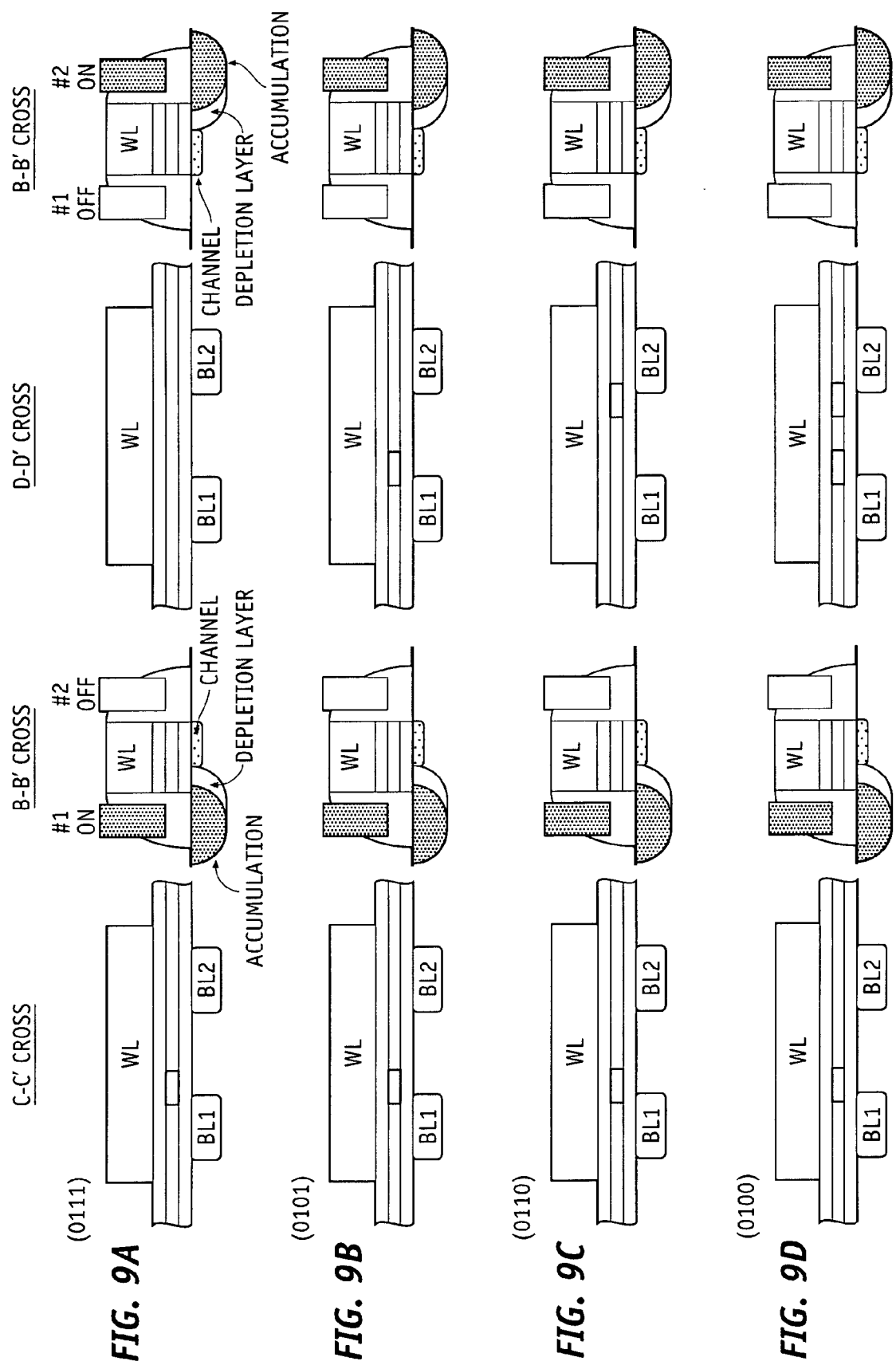

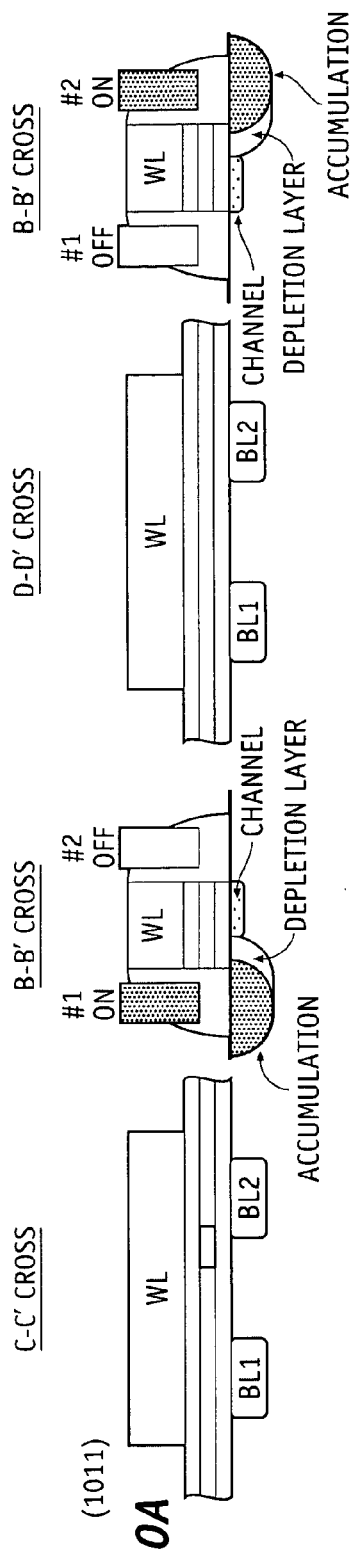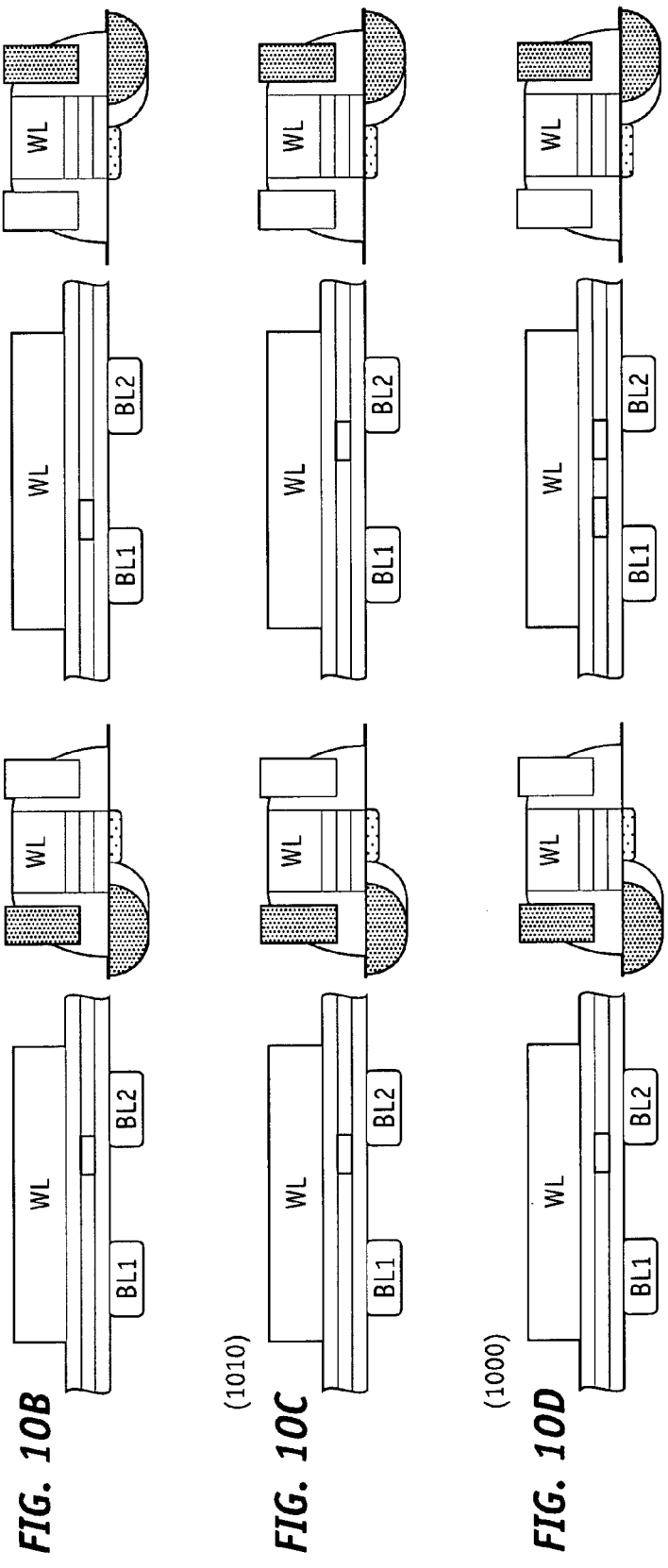
FIG. 10A (1011)
FIG. 10B (1001)
FIG. 10C (1010)
FIG. 10D (1000)

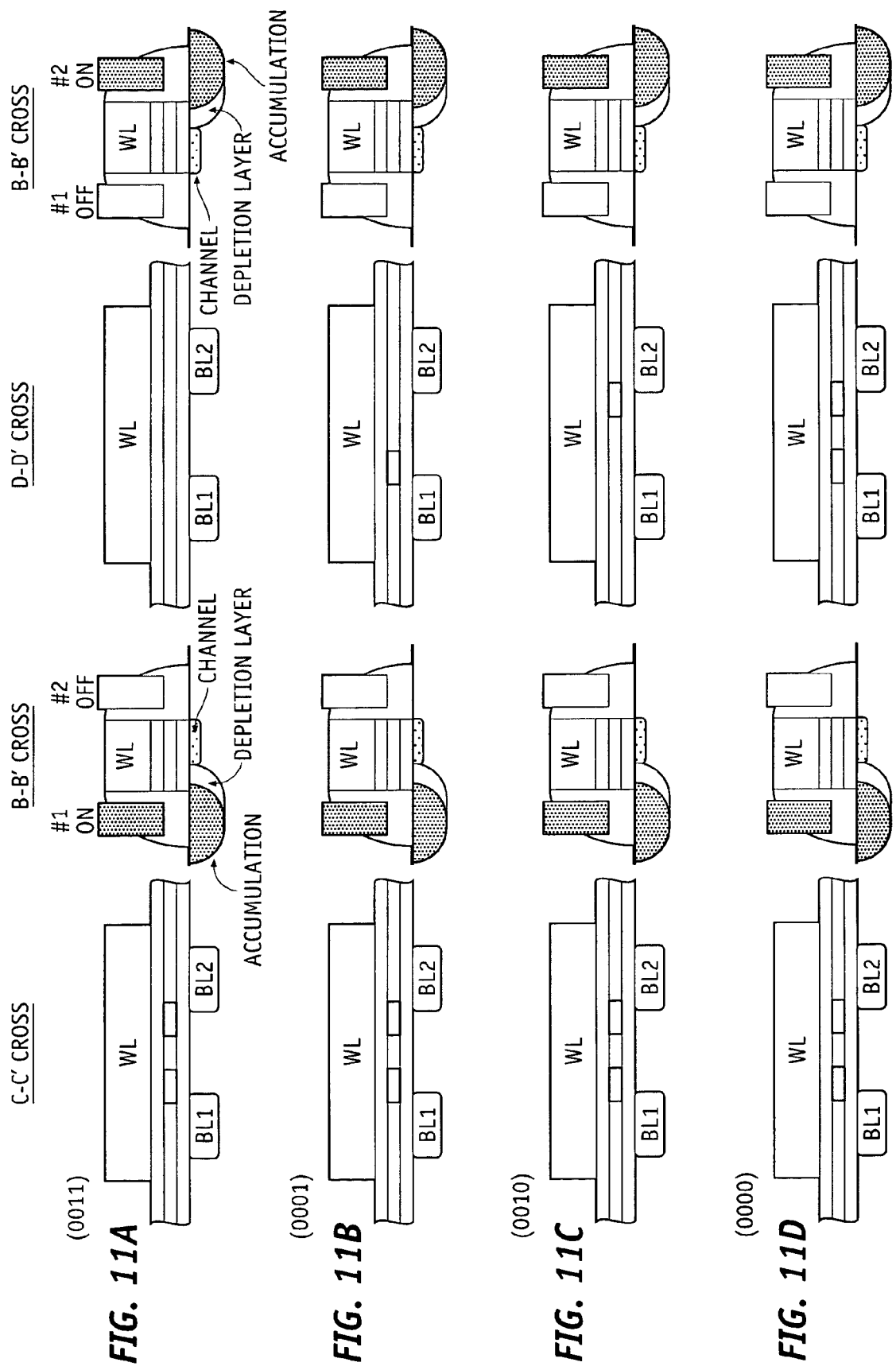

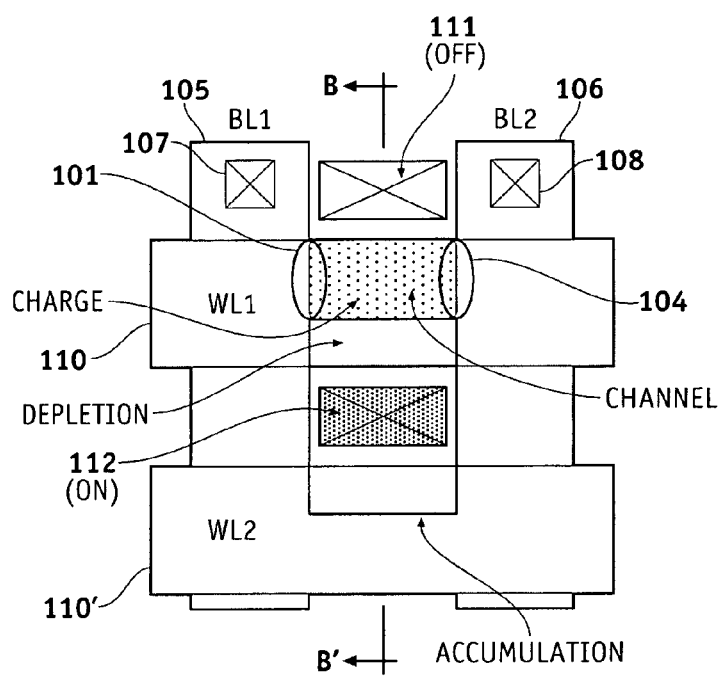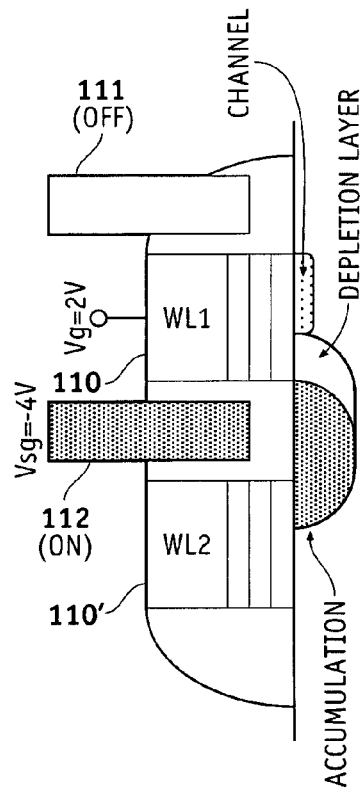
FIG. 18A
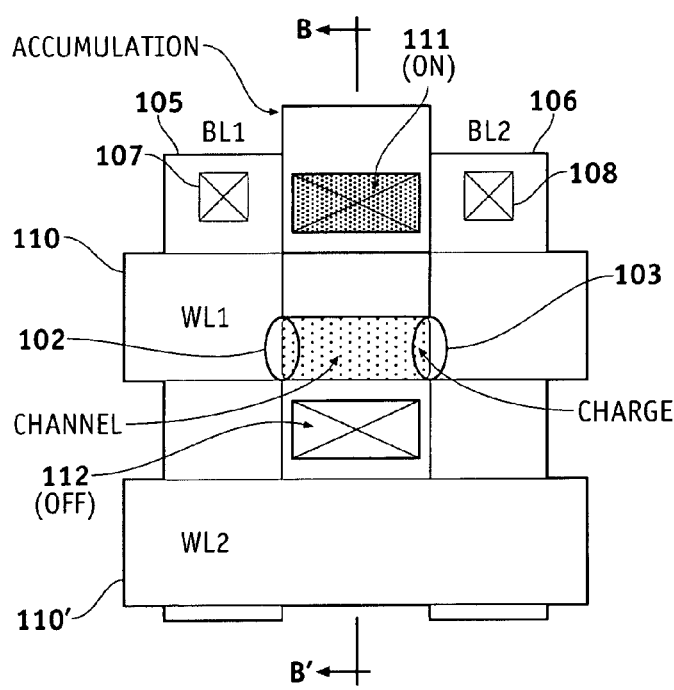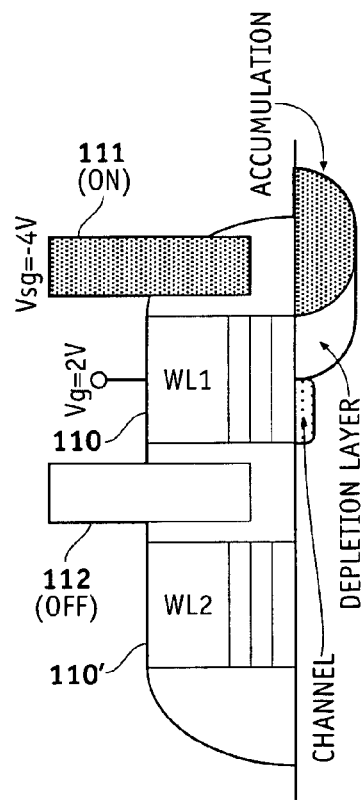
FIG. 18B

NON-VOLATILE MEMORY AND METHOD OF CONTROLLING THE SAME

CROSS-REFERENCES TO RELATED APPLICATIONS

This is a continuation of International Application No. PCT/JP2005/001246 filed Jan. 28, 2005, which was not published in English under PCT Article 21(2).

BACKGROUND

1. Field of the Invention

The present invention relates to a SONOS non-volatile memory and a method of controlling a SONOS non-volatile memory, and more particularly, to a multi-value technique for increasing the storage capacity per unit cell without a decrease in the area of each unit cell.

2. Description of the Related Art

There has been a SONOS structure developed as one type of non-volatile memory structure. In the SONOS structure, an ONO film (a laminated film of oxide film/nitride film/oxide film) is used as the gate insulating film to be provided immediately below the gate electrode. Charges are locally accumulated in the nitride film (generally, a silicon nitride film) in the vicinity of the source region and the drain region and data storage by two bits per cell can be carried out.

FIGS. 1A through 1C are schematic views of the multi-value cell structure of a SONOS non-volatile memory as disclosed by Boaz Eitan et al., in Electron Device Letters, Vol. 21, No. 11, p543-545 (2000) ("Boaz et al."). FIG. 1A is a schematic plan view of a cell and its vicinity area. FIG. 1B is a schematic cross-sectional view of the area in the vicinity of the single cell, taken along the line A-A' of FIG 1A. FIG. 1C is a schematic cross-sectional view of the area in the vicinity of the single cell, taken along the line B-B' of FIG. 1A.

In FIG. 1A, the region surrounded by the broken line is the region of a single memory cell 10. This single cell 10 is located in a region in which two bit lines 13 (BL1) and 14 (BL2) cross a word line 15 (WL1). The two bit lines 13 and 14 extend in the vertical direction of the drawing, and have electrodes 17 and 18 to which a bias can be applied. The word line 15 extends in the horizontal direction of the drawing. The single cell 10 is a 2-bit multi-value cell, and has two charge accumulation regions 11 and 12. A word line 16 (WL2) is connected to a single cell (not shown) that is located on the lower side of the drawing and is adjacent to the single cell 10.

As shown in FIG. 1B, an ONO film is formed as a gate insulating film 19 on the bit lines 13 and 14. The ONO film is a three-layer structure that includes a lower silicon oxide film 20, a silicon nitride film 21, and an upper silicon oxide film 22 stacked in this order. The word line 15 is formed on the ONO film. Two portions of the silicon nitride film 21 in the vicinity of the bit lines 13 and 14 serve as charge accumulation regions 11 and 12 for holding and releasing charge in accordance with applied bias. The charge accumulation regions 11 and 12 are mirror symmetric to each other. In short, the charge accumulation regions constitute a mirror bit structure. As shown in FIG. 1C, side walls 23 are formed on side faces of the word line 15 and the gate insulating film 19.

FIGS. 2A through 2D illustrate a situation in which charges are held in the SONOS non-volatile memory illustrated in FIGS. 1A through 1C. FIGS. 2A through 2D are schematic cross-sectional views of the SONOS non-volatile memory taken along the line A-A' of FIG. 1A. As described above, the single cell 10 has the two charge accumulation regions 11 and 12. Accordingly, four different charge holding states (storage states) can be observed through combinations of the state in which charges are accumulated in a charge accumulation region (represented by "0") and the state in which charges are not accumulated in a charge accumulation region (represented by "1"). More specifically, FIG. 2A shows the state (11) in which charges are not accumulated in either of the charge accumulation regions 11 and 12. FIG. 2B shows the state (01) in which charges are accumulated in the charge accumulation region 11 but are not accumulated in the charge accumulation region 12. FIG. 2C shows the state (10) in which charges are accumulated in the charge accumulation region 12 but are not accumulated in the charge accumulation region 11. FIG. 2D shows the state (00) in which charges are accumulated in both of the charge accumulation regions 11 and 12.

Recently, increasing memory capacity has been one of the critical objectives in the development of non-volatile memories. The SONOS non-volatile memory disclosed by Boaz Eitan et al., has a storage capacity of 2 bits per cell. However, to further increase the memory capacity, it is necessary to reduce the area of each unit cell through miniaturization techniques.

However, when a memory is manufactured in accordance with these miniaturization techniques so as to reduce the cell area, a new technology for avoiding technical problems caused in conjunction with the miniaturizing process is demanded, and an increase in production costs is caused. As a result, a technique for increasing the storage capacity per unit cell without a decrease in unit cell area is required.

SUMMARY OF THE INVENTION

It is therefore an object of the present invention to provide a non-volatile memory that can increase the storage capacity per unit cell without a decrease in unit cell area, and a method of controlling such a non-volatile memory.

So as to achieve the above object, the present invention provides a non-volatile memory that includes a gate insulating film that includes an ONO film having a first oxide film, a nitride film, and a second oxide film stacked in this order on a semiconductor substrate and control electrodes that are provided on both sides of a gate electrode of each memory cell. In this structure, the control electrodes provided on both sides of a gate electrode of each memory cell allow voltage to be applied to a selected control electrode and the gate electrode. Accordingly, charge can be accumulated in two or more regions independently of each other in the nitride film.

In a non-volatile memory in accordance with the present invention, a charge accumulation region in the nitride film interposed between the control electrodes is operatively divided into four parts. With this structure, the storage capacity per unit cell can be increased.

In the non-volatile memory in accordance with the present invention, a channel formed between the control electrodes has a width less than half the width of the gate electrode. With this structure, control can be performed so that charge is accumulated in the two or more regions independently of each other in the nitride film.

In the non-volatile memory in accordance with the present invention, each memory cell has four charge accumulation regions located below the gate electrode, and the four charge accumulation regions are arranged in rows and columns. Accordingly, a charge accumulation region can be selected by switching addresses.

In the non-volatile memory in accordance with the present invention, the memory cells are arrayed in a first direction and a second direction. This non-volatile memory further includes word lines and bit lines running in the first direction and the second direction respectively. In this non-volatile memory, the word lines provide gate electrodes for the memory cells aligned in the first direction, and the bit lines provide sources and drains for the memory cells aligned in the second direction. Accordingly, the number of memory cells per unit area on the semiconductor substrate can be increased.

In the non-volatile memory in accordance with the present invention, the bit lines are embedded in the semiconductor substrate. Since there is no need to maintain a space for the bit lines on the semiconductor substrate, the number of memory cells can be increased or some other component can be placed on the semiconductor substrate.

In the non-volatile memory in accordance with the present invention, each of the control electrodes is provided in a region defined by two adjacent word lines and two adjacent bit lines. Accordingly, it becomes easier to form a channel region and accumulation regions for accumulating charge selectively in the charge accumulation regions.

In the non-volatile memory in accordance with the present invention, the control electrodes are arranged in rows and columns. With this structure, a control electrode necessary for write or read can be properly selected.

In the non-volatile memory in accordance with the present invention, the gate electrode and the control electrodes are supplied with voltages such that a channel width becomes less than half the width of the gate electrode.

In the non-volatile memory in accordance with the present invention, the gate electrode is supplied with a voltage equal to or higher than a threshold voltage so that a region in the semiconductor substrate located below the gate insulating film serves as a channel region. One of the control electrodes is supplied with a control voltage so that a region in the semiconductor substrate in the vicinity of this one of the control electrodes is an accumulation region. In this structure, a depletion region formed in the semiconductor substrate and located between the accumulation region and the channel region defines a channel width. Accordingly, charge can be accumulated selectively in the charge accumulation regions in the nitride film.

In the non-volatile memory in accordance with the present invention, conditions for biasing the sources and drains are alternately switched so that write and read operations may be performed. As the conditions for biasing the sources and drains are alternately switched, write and read operations can be performed on the memory cells.

In the non-volatile memory in accordance with the present invention, the gate electrodes are preferably made of polysilicon.

In the non-volatile memory in accordance with the present invention, the semiconductor substrate may be composed of a P-conduction type, and the gate receives a positive bias voltage while the control electrodes receive negative bias voltages. As the biases to be applied to the gate electrode and the control electrodes are adjusted in accordance with the conductivity type of the semiconductor substrate, a desired charge accumulation region can be selected and operations such as charge accumulation and reading can be performed on the selected charge accumulation region.

In the non-volatile memory in accordance with the present invention, the semiconductor substrate may alternatively be composed of an N-conduction type, and the gate receives a negative bias voltage while the control electrodes receive positive bias voltages. As the biases to be applied to the gate electrode and the control electrodes are adjusted in accordance with the conductivity of the semiconductor substrate, a desired charge accumulation region can be selected and operations such as charge accumulation and reading can be performed on the selected charge accumulation region.

The present invention also provides a method of controlling a non-volatile memory having an ONO film on a semiconductor substrate. This method includes the steps of applying a voltage to a gate electrode that is shared among memory cells and applying another voltage to one of two control electrodes between which the gate electrode is interposed. Here, four charge accumulation regions are formed in a nitride film of the ONO film in a region that is located below the gate electrode and is interposed between the two control electrodes. As voltages are applied to the selected control electrode and the gate electrode, charges can be accumulated in the charge accumulation regions independently of each other in the nitride film.

In accordance with this method, the voltage to be applied to the gate electrode may be a positive voltage, while the voltage to be applied to the selected control electrode would then be a negative voltage.

Alternatively, in accordance with this method, the voltage to be applied to the gate electrode may be a negative voltage, while the voltage to be applied to the selected control electrode would then be a positive voltage.

While two portions of the ONO film in the vicinity of the source and the drain below the word line serve as the charge accumulation regions in a conventional structure, four charge accumulation regions are formed by dividing each of the two charge accumulation regions into two regions in accordance with the present invention. Accordingly, the present invention can provide a multi-value cell technique that increases the storage capacity per unit cell to four times as large (four bits per cell) as the storage capacity of a conventional cell without a reduction in unit cell area.

BRIEF DESCRIPTION OF THE DRAWINGS

FIGS. 1A through 1C are schematic views illustrating the multi-value cell structure of a conventional SONOS non-volatile memory;

FIGS. 4A through 4C illustrate the situation in which the region on the surface of the semiconductor substrate located immediately below the word line is put into an accumulation state when a bias is applied to a control electrode in accordance with an embodiment of the present invention;

FIGS. 8A through 8D illustrate the conditions (ON/OFF) for bias application to the control electrodes so as to achieve sixteen charge holding states in a 4-bit cell in accordance with an embodiment of the present invention;

FIGS. 9A through 9D also illustrate the conditions (ON/OFF) for bias application to the control electrodes so as to achieve sixteen charge holding states in a 4-bit cell in accordance with an embodiment of the present invention;

FIGS. 10A through 10D also illustrate the conditions (ON/OFF) for bias application to the control electrodes so as to achieve sixteen charge holding states in a 4-bit cell in accordance with an embodiment of the present invention;

FIGS. 11A through 11D also illustrate the conditions (ON/OFF) for bias application to the control electrodes so as to achieve sixteen charge holding states in a 4-bit cell in accordance with an embodiment of the present invention;

FIGS. 18A and 18B illustrate the write operation of a SONOS non-volatile memory in accordance with an embodiment of the present invention: each left side drawing is a schematic plan view of two adjacent cells and their vicinity area; and each right-side drawing is a schematic cross-sectional view of a single cell, taken along the line B-B' of each left-side drawing;

DESCRIPTION OF THE PREFERRED EMBODIMENTS

The following is a description of embodiments of the present invention, with reference to the accompanying drawings.

In accordance with the present invention, so as to increase the storage capacity per single cell, four charge accumulation regions are formed by dividing each of two charge accumulation regions into two regions. In a conventional structure, the two charge accumulation regions are formed in the vicinity of the source/drain of the nitride film of an ONO film provided below the word line. In accordance with the present invention, each single cell serves as a SONOS non-volatile memory of four bits per cell. Accordingly, charge holding states (storage states) of sixteen different types can be obtained and a storage capacity per unit cell that is four times as large as the conventional storage capacity per unit cell can be achieved.

Figure 2A:
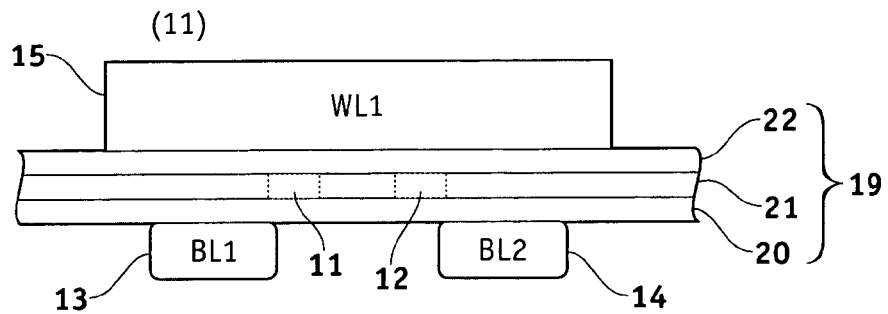
FIGS. 2A through 2D illustrate the charge holding states of the SONOS non-volatile memory shown in FIGS. 1A through 1C.
Figure 2B:
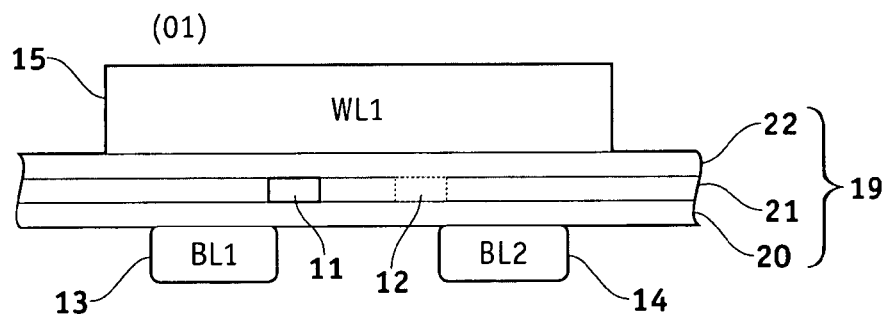
Figure 2C:
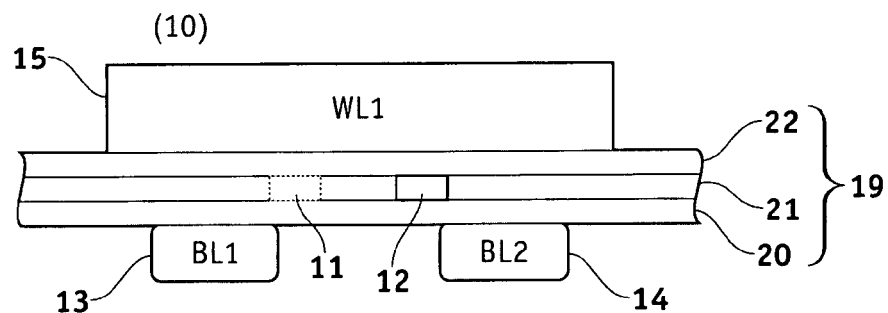
Figure 2D:
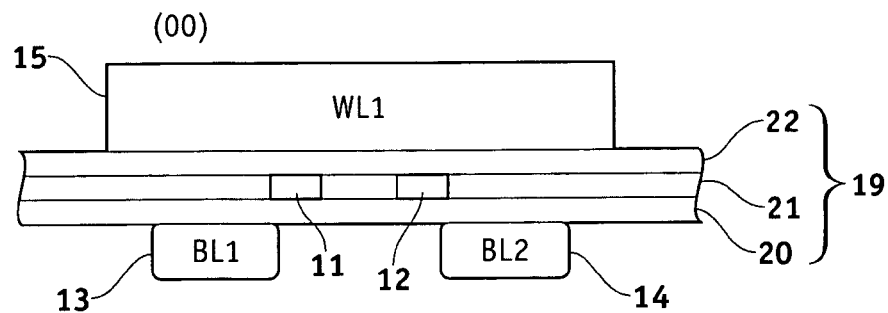
Figure 3:
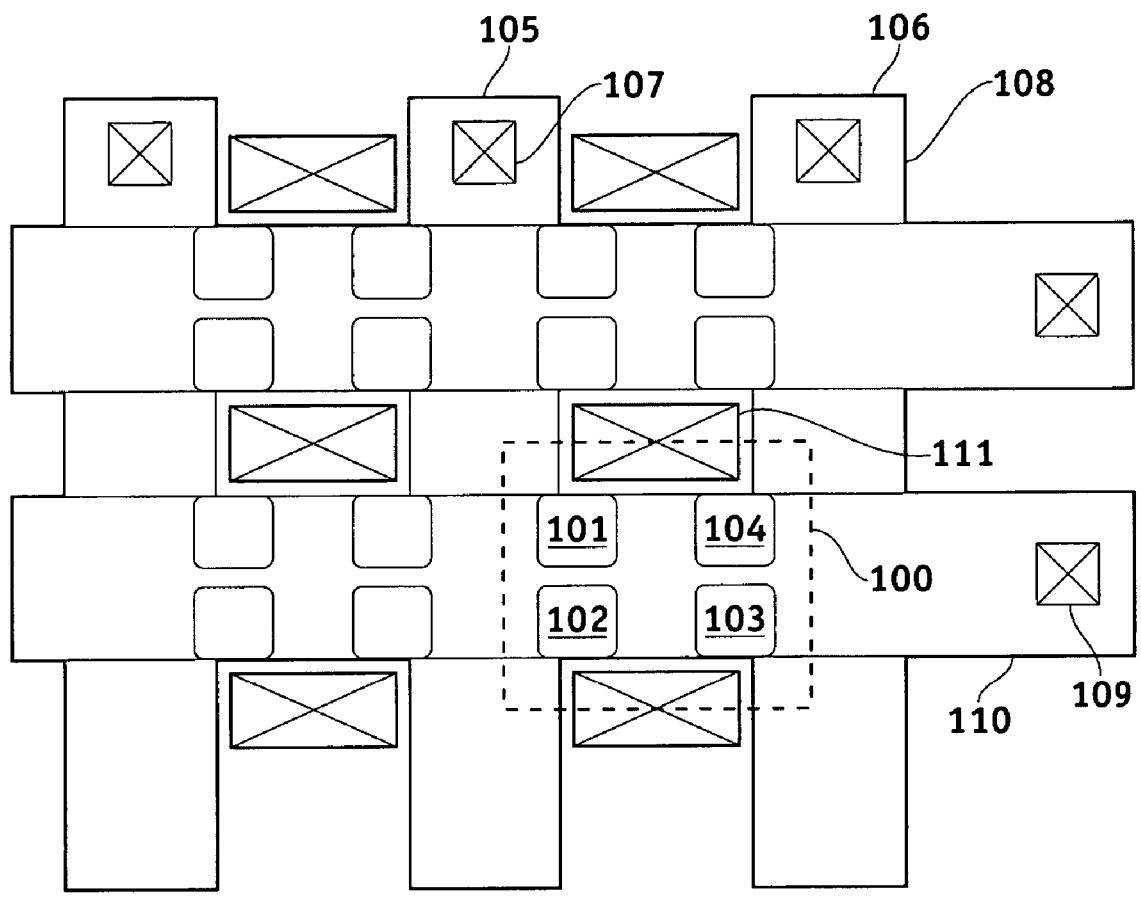
FIG. 3 is a schematic plan view illustrating the concept of a multi-value cell structure and showing the layout of the charge accumulation regions provided in each memory cell in accordance with an embodiment of the present invention.

FIG. 3 is a schematic plan view illustrating the arrangement of the charge accumulation regions provided in each memory cell, illustrating the concept of achieving a multi-value technique in accordance with the present invention. In FIG. 3, the region surrounded by a broken line is the region of a single cell 100, and four single cells are shown in FIG. 3. The single cell 100 is provided at a location at which two bit lines 105 and 106 cross a word line. The two bit lines 105 and 106 extend in the vertical direction of the drawing and have electrodes 107 and 108. The word line 110 has an electrode 109 and extends in the horizontal direction. The gate insulating film of the single cell 100 is also formed with an ONO film, and has side walls formed on the sides of the gate insulating film and the word line 110.

The single cell 100 is a multi-value cell of four bits, and includes four charge accumulation regions denoted by reference numerals 101, 102, 103, and 104. Two plug-like control electrodes 111 and 112 for controlling the width of a channel to be formed in a region on the surface of a semiconductor substrate immediately below the word line 110 upon application of a bias in a later described manner, are formed in each region surrounded by word lines and bit lines. More specifically, when a bias is applied to the plug-like control electrodes 111 and 112 and the word line 110, the region on the surface of the semiconductor substrate that is immediately below the word lines and corresponds to the location of the bias applied control electrodes is put into an accumulation state or a depletion state. Accordingly, the channel width is controlled and, thereby, the charge holding state of each of the four charge accumulation regions is controlled through the control of the channel width.

FIGS. 4A through 4C illustrate the situation in which the region on the surface of the semiconductor substrate immediately below the word line is put into an accumulation state when a bias is applied to the plug-like control electrodes. FIG. 4A is a schematic plan view of two adjacent cells and their neighboring area. FIG. 4B is a cross-sectional view of a single cell, taken along the line A-A' of FIG. 4A. FIG. 4C is a cross-sectional view of a single cell, taken along the line B-B' of FIG. 4A. The upper half of FIG. 4C illustrates a situation in which a bias is not applied to the plug-like control electrodes 111 and 112. The lower half illustrates a situation in which a bias is applied to the plug-like control electrode 112.

As a bias is applied to one of the two plug-like control electrodes 111 and 112 (112 in FIG. 4C) that is newly provided in the region surrounded by bit lines and word lines, the region on the surface of the semiconductor substrate on the side of the bias-applied plug-like control electrode 112 is put into an accumulation state. The accumulation region partially covers the surface of the substrate on which the single line cell 100 connected to the word line 110 is disposed and the surface of the substrate on which a single cell 100' connected to a word line 110' is disposed. The single cell 100 and the single cell 100' are provided on both sides of the bias-applied plug-like control electrode 112 (the lower half of FIG. 4C). The rectangle shown in FIG. 4A conceptually represents the accumulation region.

Here, the type (negative or positive) and the size of the bias to be applied are determined by the conductivity type and the permitivity of the substrate employed. The size of the bias needs to be larger than the difference between the voltage applied to the gate electrode and the threshold voltage for each cell at the time of erasing. The type of bias is negative when the semiconductor substrate is of a P-conduction type, and is positive when the semiconductor substrate is of an N-conduction type. In this description of embodiments of the present invention, the semiconductor substrate is of P-conduction type, unless otherwise specified. Accordingly, the bias applied so as to turn the above described region on the surface of the semiconductor substrate into an accumulation region is negative.

Since the non-volatile memory is of a SONOS type, a gate insulating film 19 formed on the bit lines is an ONO film that has a silicon oxide film 20, a silicon nitride film 21, and a silicon oxide film 22 stacked in this order. Side walls 23 are formed on the sides of the word lines and the gate electrode film.

Figure 5A:
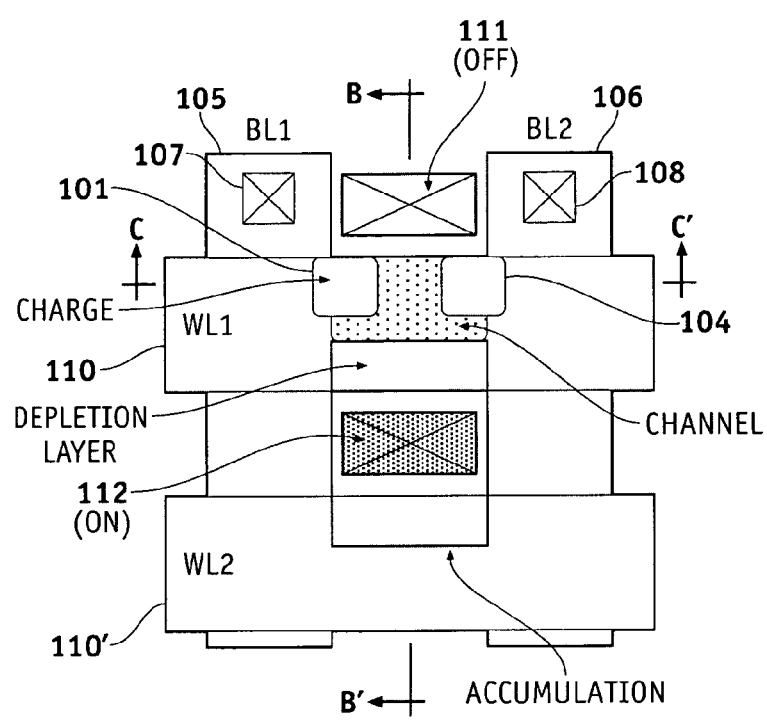
FIGS. 5A through 5C illustrate a variation of the location and the width of the channel that is caused when a bias is applied to the word line in accordance with an embodiment of the present invention.
Figure 5C:
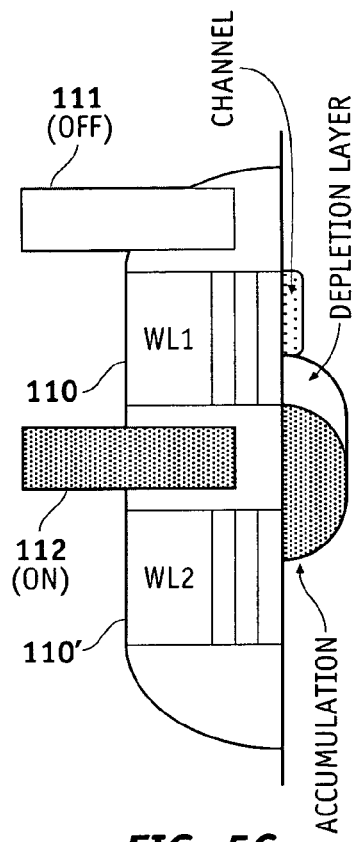
Figure 5B:
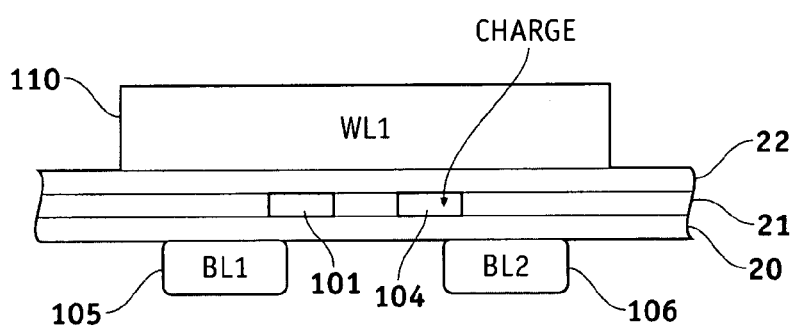
Figure 6A:
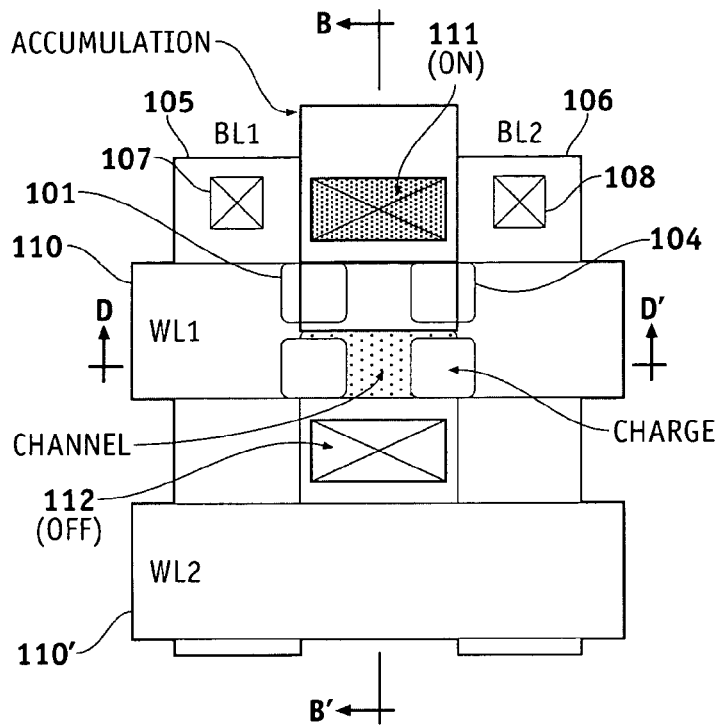
FIGS. 6A through 6C illustrate another variation of the location and the width of the channel that is caused when a bias is applied to the word line in accordance with an embodiment of the present invention.
Figure 6C:
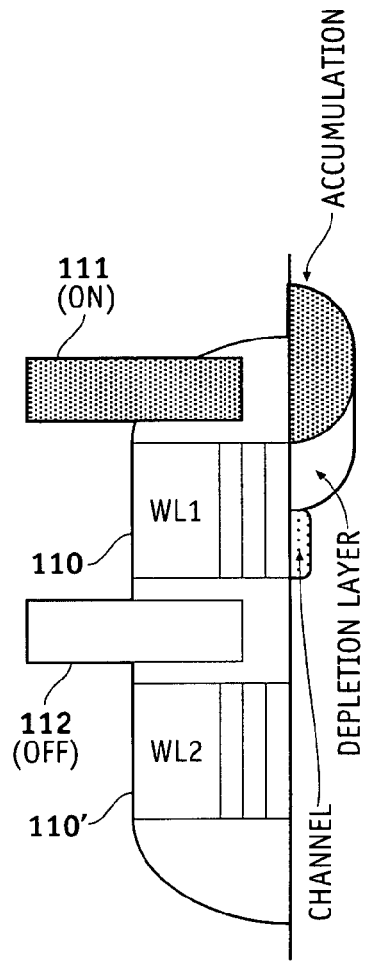
Figure 6B:
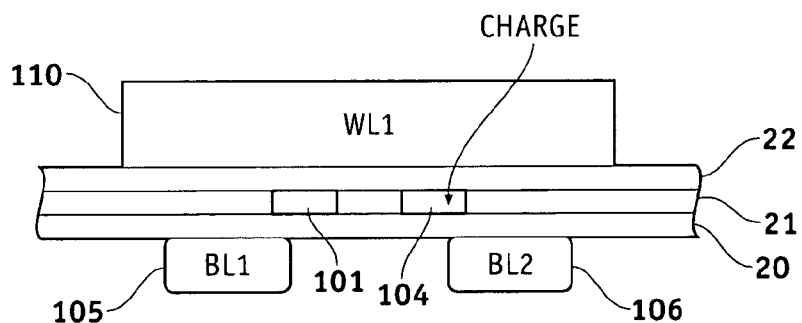

FIGS. 5A through 5C and FIGS. 6A through 6C illustrate variations of the location and the width of the channel that are caused when a bias is applied to the word lines. FIGS. 5A and 6A are schematic plan views each illustrating two adjacent cells and their vicinity. FIGS. 5B and 6B are schematic cross-sectional views of the single cells, taken along the line C-C' of FIG. 5A and the line D-D' of FIG. 6A, respectively. FIGS. 5C and 6C are schematic cross-sectional views of the single cells, taken along the line B-B' of FIGS. 5A and 6A.

Referring first to FIGS. 5A through 5C, a voltage $V_g$ (a positive voltage in this case) that is equal to or higher than a threshold voltage value is applied to the word line 110, while an accumulation state illustrated in the lower half of FIG. 4C is formed by applying a bias to the plug-like control electrode 112. A depletion region is then formed on a side face of the accumulation region formed on the surface of the semiconductor substrate immediately below the word line 110 in the vicinity of the plug-like control electrode 112. As a result, a channel is selectively formed in a region that is located immediately below the word line 110 on the opposite side from the plug-like control electrode 112 and is on the side of the unbiased control electrode 111.

The width of the channel varies with the magnitude of the negative voltage to be applied to the control electrode and the magnitude of the positive voltage to be applied to the word line. In the present invention, however, bias setting is performed so that the channel width becomes less than ½ of the cell width. By doing so, charge injection can be performed on the charge accumulation region 101 through the bit line 105 and on the charge accumulation region 104 through the bit line 106 independently of each other.

Referring now to FIGS. 6A through 6C, an accumulation state is formed in the region on the surface of the semiconductor substrate immediately below the plug-like control electrode 111 by applying a bias thereto. As a voltage $V_g$ (also a positive voltage in this case) that is equal to or higher than a threshold voltage value is applied to the word line 110, a depletion region is formed on a side face of the accumulation region formed on the surface of the semiconductor substrate immediately below the word line 110 in the vicinity of the plug-like control electrode 111. As a result, a channel is selectively formed in a region that is located immediately below the word line 110 on the opposite side from the plug-like control electrode 111 and is on the side of the unbiased control electrode 112. Here, bias setting is also performed so that the channel width becomes less than ½ of the cell width. By doing so, charge injection can be performed on the charge accumulation region 102 through the bit line 105 and on the charge accumulation region 103 through the bit line 106 independently of each other.

As described above, in accordance with the present invention, charges can be accumulated in the four independent regions on the nitride film of the gate insulating film located below the word line and a multi-value operation can be realized, with the number of bits in each single cell being four.

Figure 7A:
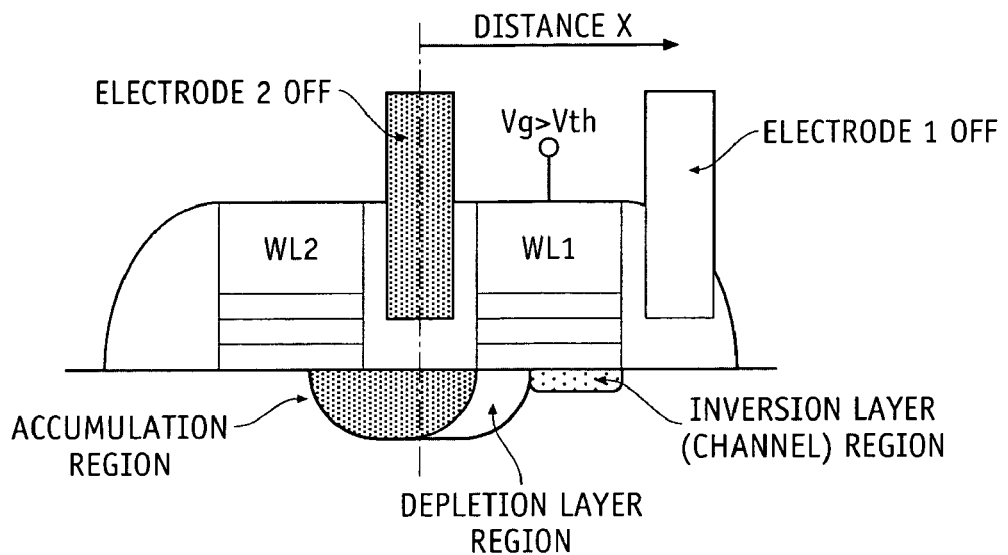
FIGS. 7A and 7B illustrate the gate voltage dependence of the channel width that is observed when a bias is applied to only one of the control electrodes in accordance with an embodiment of the present invention.
Figure 7B:
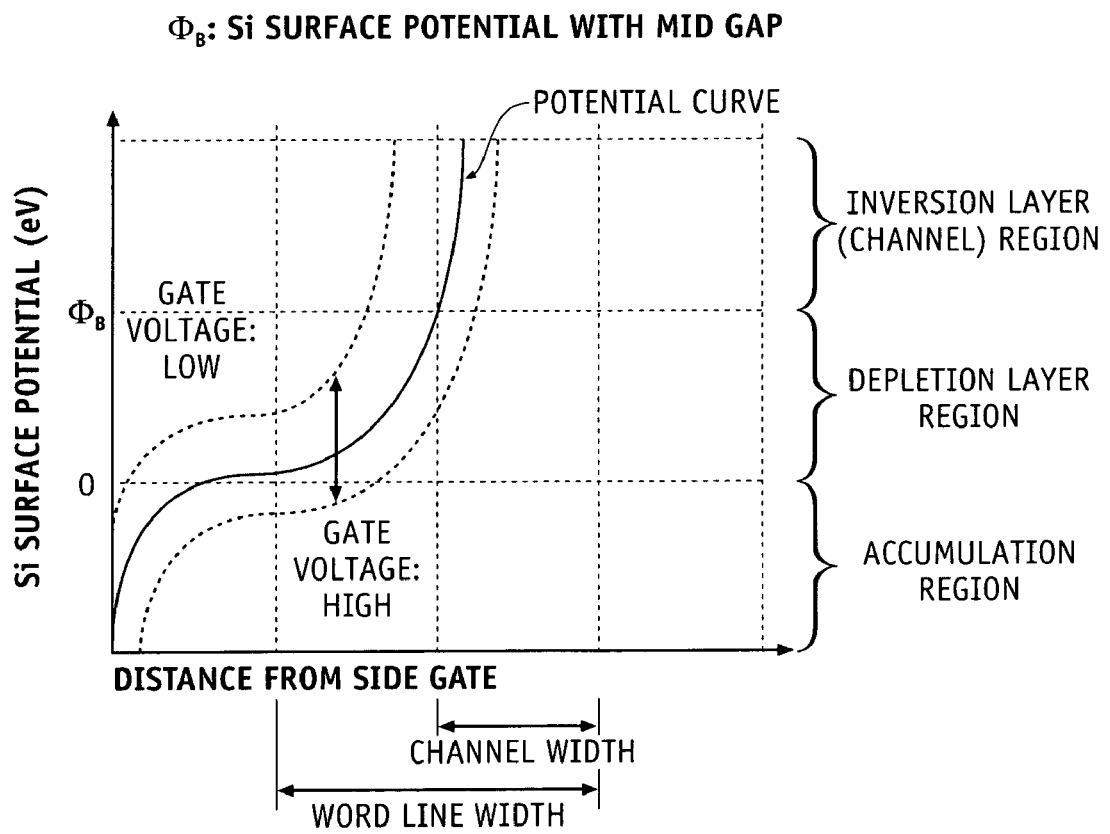

FIGS. 7A and 7B illustrate the gate voltage dependence of the channel width in a case where a bias is applied to only one of the control electrodes. As shown in FIG. 7A, a bias $V_g$ that is equal to or higher than a threshold voltage value $V_{th}$ is applied to the gate electrode while a bias is applied to only one electrode (Electrode 1) of the two control electrodes. FIG. 7B shows the potential distribution on the surface of a silicon substrate as it relates to the distance from the center of the biased control electrode (or the distance from the side gate). As shown in this drawing, the potential curve varies with the applied gate voltage $V_g$, and the areas of the accumulation region, the depletion region, and the inversion region (the channel) vary with the variation of the potential curve. As already mentioned, a gate voltage Vg is applied so that the channel width becomes less than ½ of the word line width in the present invention. Therefore, a bias that is equal to or higher than the gate voltage $V_g$, according to the potential curve as indicated by the solid line in FIG. 7B, is applied.

FIGS. 8A through 11D are schematic cross-sectional views showing the relationships between the bias application (ON/OFF) to the plug-like control electrodes 1 11 and 112 and the sixteen patterns of charge holding states that are observed with each four-bit cell in accordance with the present invention. In these drawings, B-B', C-C', and D-D' indicate the lines shown in FIGS. 5A and 6A, and sections taken along those lines are shown. In these drawings, the two control electrodes are represented by electrodes "#1" and "#2", the word line is represented by "WL", and the two bit lines are represented by "BL1" and "BL2". Also in these drawings, a status (abcd) indicates that the states of the charge accumulation regions 101, 104, 102, and 103 are a, b, c, and d. For example, the status (1110) indicates that the charge accumulation regions 101, 104, and 102 are empty (status "1") and only the charge accumulation region 103 holds charge (status "0").

In the following, the present invention is described in greater detail, by way of specific examples.

Manufacturing Process 1

Figure 12A:
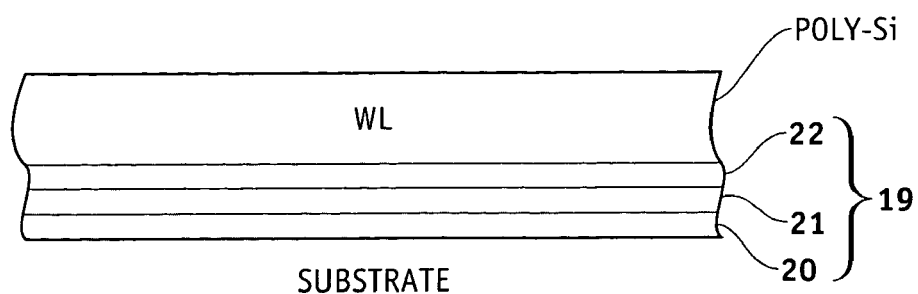
FIGS. 12A through 12D are schematic cross-sectional views illustrating an example of the process for manufacturing a SONOS non-volatile memory in accordance with a first embodiment of the present invention.

FIGS. 12A through 14 illustrate an example of the process of manufacturing a SONOS non-volatile memory having the above described plug-like control electrodes in accordance with the present invention. First, an insulating film 19 having an ONO structure is formed by stacking a silicon oxide film 20 having a film thickness of 7.8 nm, a silicon nitride film 21 having a film thickness of 8.5 nm, and a silicon oxide film 22 having a film thickness of 10 nm in this order on a p-type silicon substrate. A phosphorus-doped polysilicon film (120 nm in film thickness) is formed on the insulating film 19 (FIG. 12A).

Figure 12B:
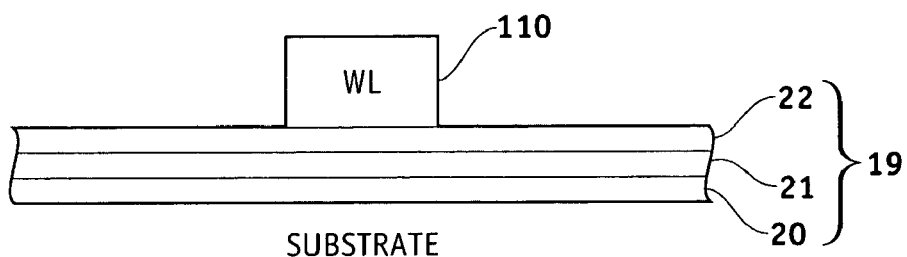
Figure 12C:
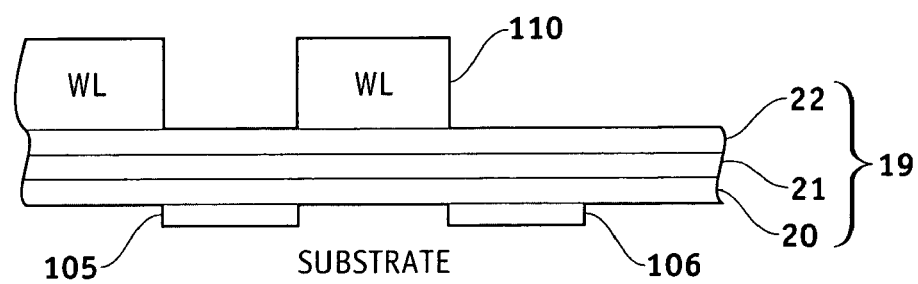

The word lines 110 are then formed by patterning the polysilicon film by a photolithography technique and an etching technique (FIG. 12B). The bit lines 105 and 106 are then formed by performing ion implantation with arsenic on the surface of the silicon substrate by a photolithography technique and an ion implantation technique (FIG. 12C). Here, the conditions for ion implantation include an implantation energy of 70 KeV, and an ion implantation concentration of $2 \times 10^{15}$ cm$^{-3}$.

Figure 12D:
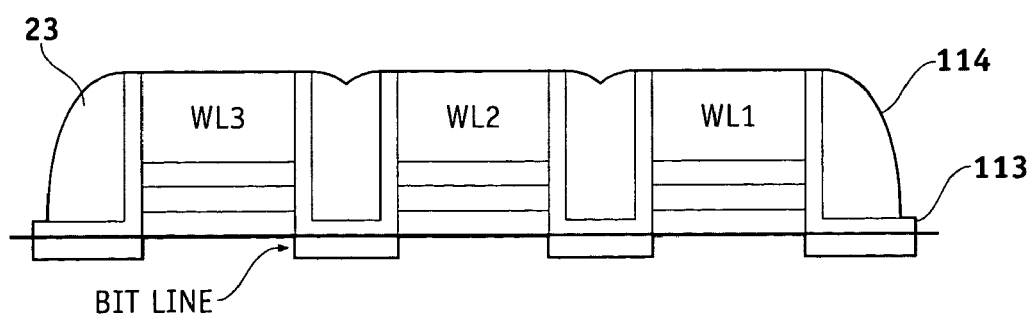

The insulating film having the ONO structure is removed except for the portion immediately below the word lines, and the side walls 23 are formed on the sides of the word lines 110 and the ONO film 19 (FIG. 12D). The side wall formation is carried out, for example, by forming a silicon nitride film 113 having a film thickness of 20 nm and a silicon oxide film 114 having a film thickness of 90 nm, and then performing etchback on these two films.

Figure 13A:
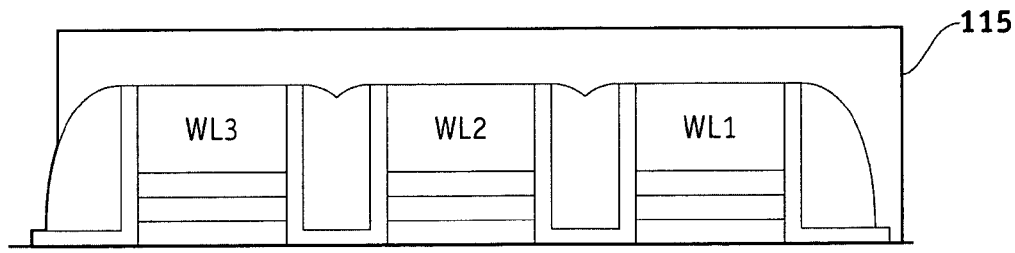
FIGS. 13A through 13D are schematic cross-sectional views illustrating the example of the process for manufacturing a SONOS non-volatile memory in accordance with the first embodiment of the present invention.
Figure 13B:
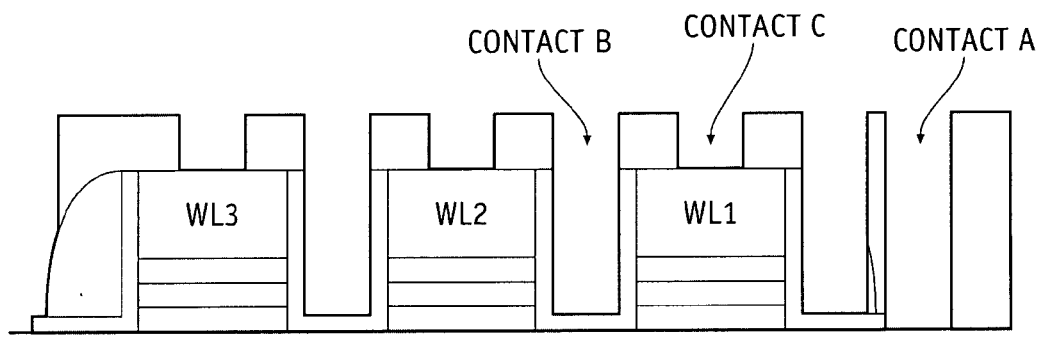
Figure 13C:
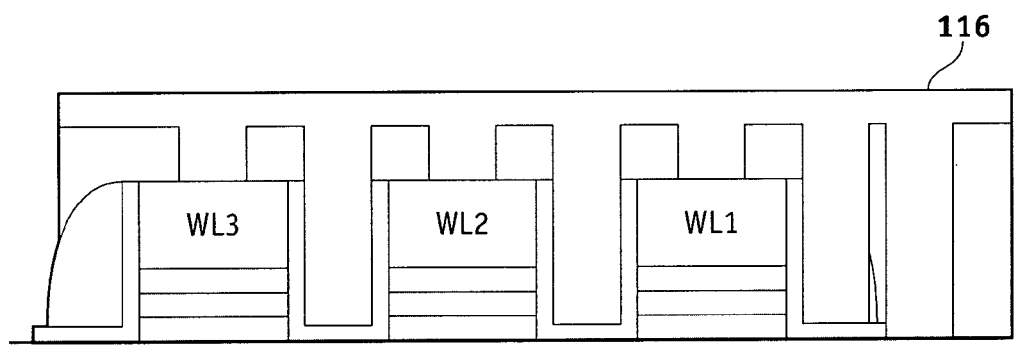
Figure 13D:
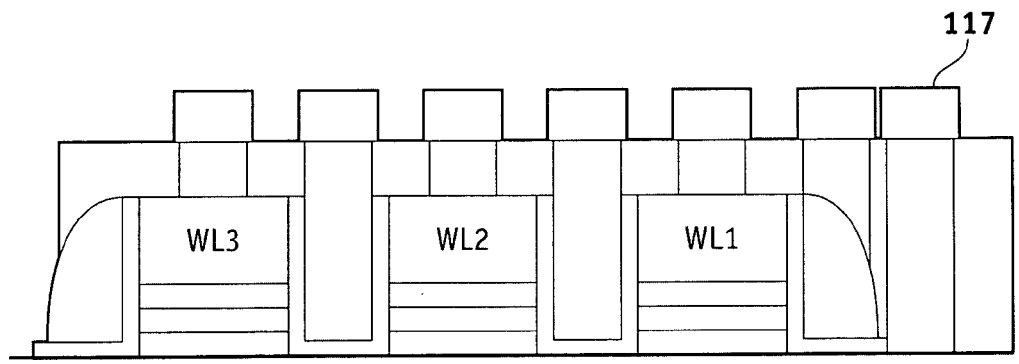
Figure 14:
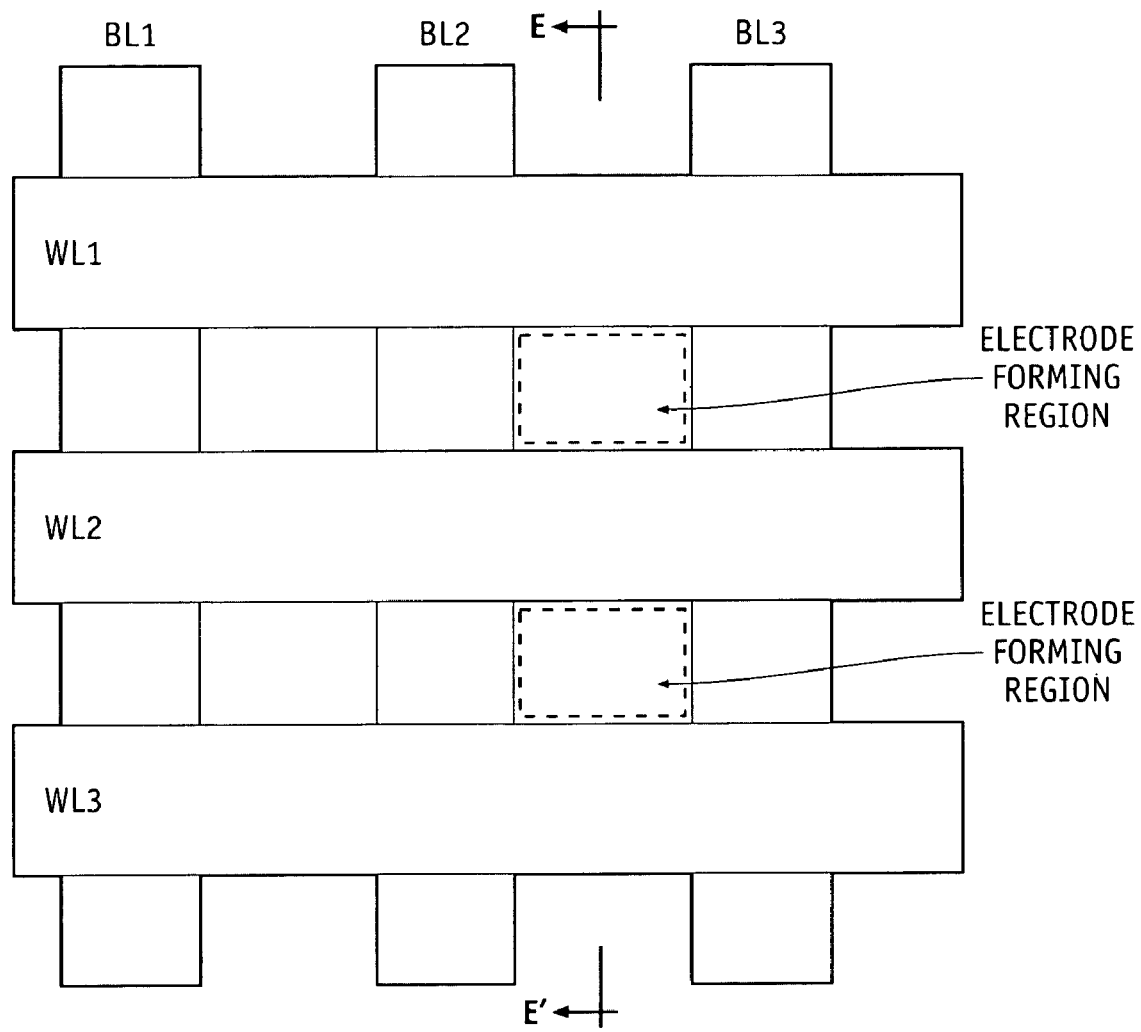
FIG. 14 is a schematic plan view during a step in the process for manufacturing a SONOS non-volatile memory in accordance with the first embodiment of the present invention.

After the above described procedures, the layout illustrated in the schematic plan view of FIG. 14 is obtained and plug-like control electrodes are to be formed in the region indicated by the broken line in the drawing. In the following, the procedures for forming the plug-like control electrodes and the procedures following are described in conjunction with FIGS. 13A through 13D that are schematic cross-sectional views taken along the line E-E' of FIG. 14.

First, an interlayer insulating film 115 such as a BPSG (boro-phospho silicated glass) film having a thickness of 1500 nm, for example, is deposited on the entire surface of the substrate (FIG. 13A). Contact holes are then formed between the side walls of word lines (denoted by WL1 through WL3) and on the word lines by a photolithography technique and an etching technique (FIG. 13B). The bottom of each of the contact holes (contact holes C) formed on the word lines is located in the same plane as the upper face of each word line. The bottom of each of the contact holes formed between the side walls of the word lines (the contact holes B) is located in the same plane as the upper face of the remaining silicon nitride film 113 that functions as an etching stopper layer. The bottom of the contact hole (the contact hole A) that is adjacent to a contact hole B and is formed in a region not in contact with a side wall of the adjacent word lines is located in the same plane as the surface of the silicon substrate. Accordingly, contact holes A through C of three different types are formed at the same time.

Following contact hole formation, a laminated film 116 is provided (FIG. 13C). The laminated film 116 includes a barrier metal layer having a two-layer structure of a TiN film (15 nm in thickness) and a Ti film (40 nm in thickness), and a tungsten film (400 nm in thickness) formed through CVD on the barrier metal layer. After polishing is performed on the tungsten film by CMP, an Al line 117 is formed, and the electrode formation at each contact hole is completed (FIG. 13D). The electrodes embedded in the contact holes C are to serve as word lines contacts. The electrodes embedded in the contact holes B are to serve as plug-like control electrodes. The electrode embedded in the contact hole A is to serve as the substrate contact.

In the above described manner, a SONOS non-volatile memory having plug-like control electrodes in accordance with the present invention is obtained.

Manufacturing Process 2

Figure 15A:
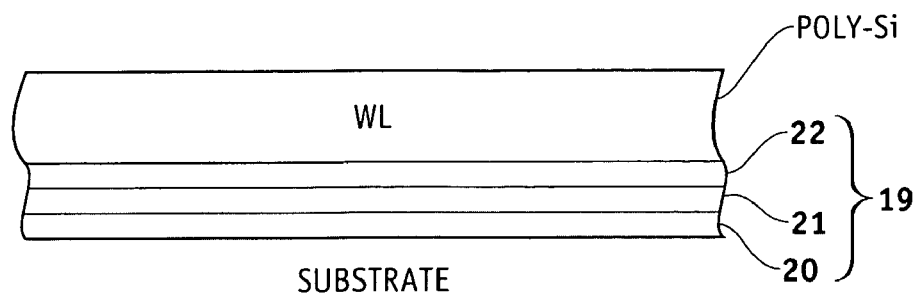
FIGS. 15A through 15D are schematic cross-sectional views illustrating an example of the process for manufacturing a SONOS non-volatile memory in accordance with a second embodiment of the present invention.

FIGS. 15A through 17 illustrate another example of the process of manufacturing a SONOS non-volatile memory in accordance with the present invention. First, an insulating film 19 having an ONO structure is formed by stacking a silicon oxide film 20 having a film thickness of 7.8 nm, a silicon nitride film 21 having a film thickness of 8.5 nm, and a silicon oxide film 22 having a film thickness of 10 nm in this order on a p-type silicon substrate. A phosphorus-doped polysilicon film (120 nm in film thickness) is formed on the insulating film 19 (FIG. 15A).

Figure 15B:
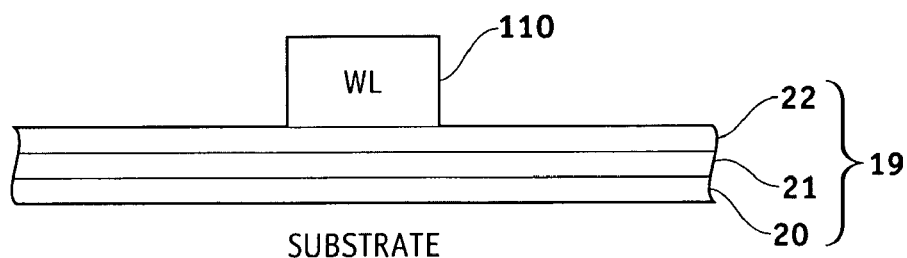
Figure 15C:
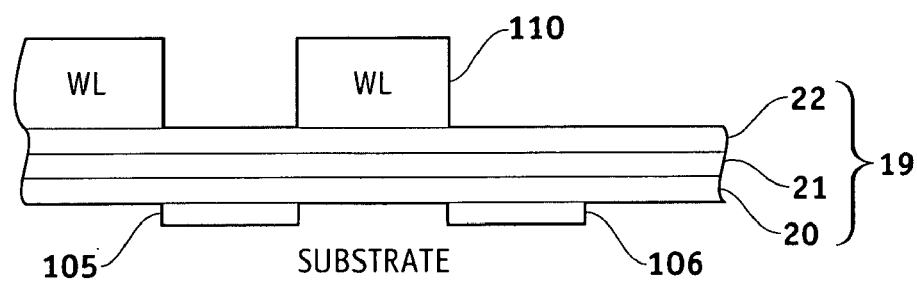

The word lines 110 are then formed by patterning the polysilicon film by a photolithography technique and an etching technique (FIG. 15B). The bit lines 105 and 106 are then formed by performing ion implantation with arsenic on the surface of the silicon substrate by a photolithography technique and an ion implantation technique (FIG. 15C). Here, the conditions for ion implantation include an implantation energy of 70 KeV, and an ion implantation concentration of $2 \times 10^{15}$ cm$^{-3}$.

Figure 15D:
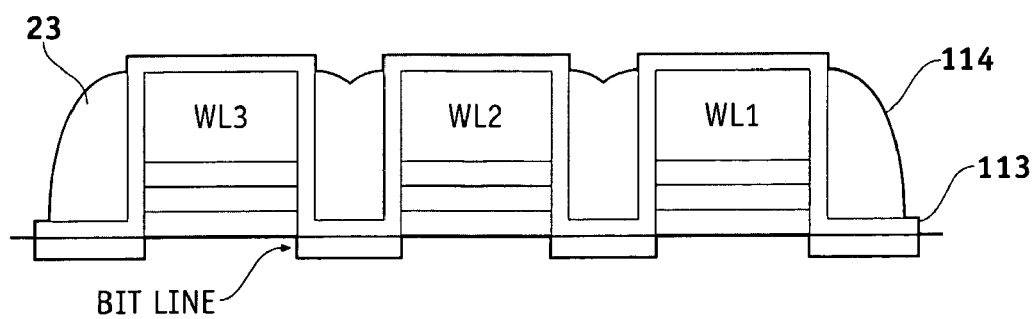

The insulating film having the ONO structure is removed except for the portion immediately below the word lines, and side walls 23 are formed on the sides of the word lines and the ONO film (FIG. 15D). The side wall formation is carried out, for example, by forming a silicon nitride film 113 having a film thickness of 20 nm and a silicon oxide film 114 having a film thickness of 90 nm, and then performing etchback on these two films.

Figure 16A:
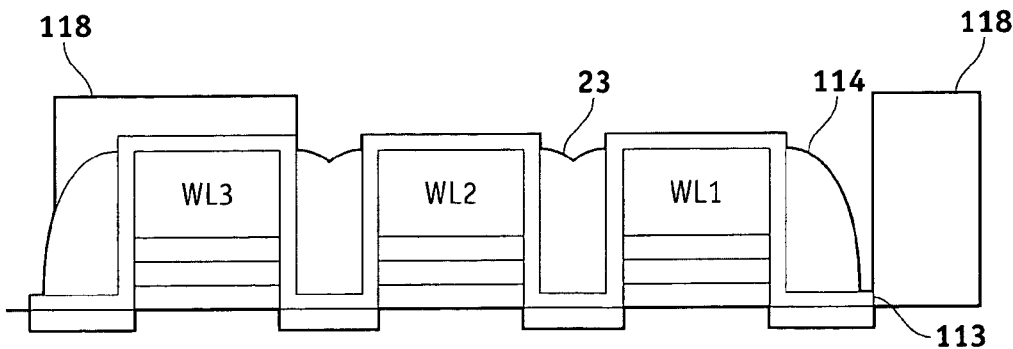
FIGS. 16A through 16D are schematic cross-sectional views illustrating the example of the process for manufacturing a SONOS non-volatile memory in accordance with the second embodiment of the present invention.
Figure 16B:
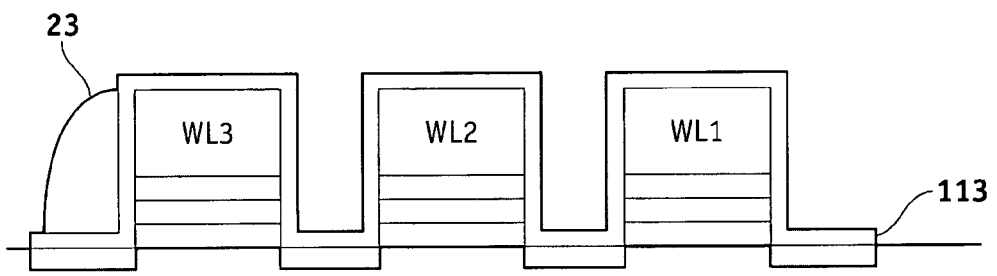
Figure 16C:
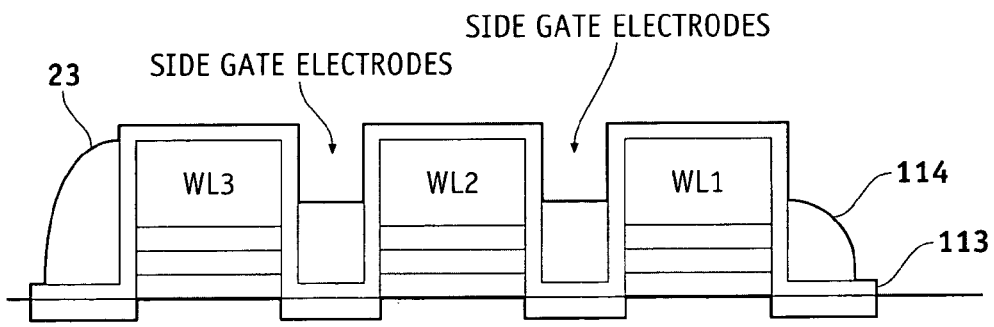
Figure 16D:
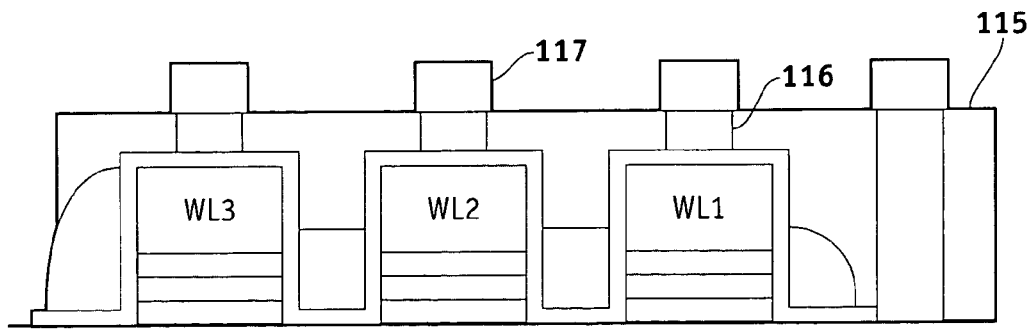
Figure 17:
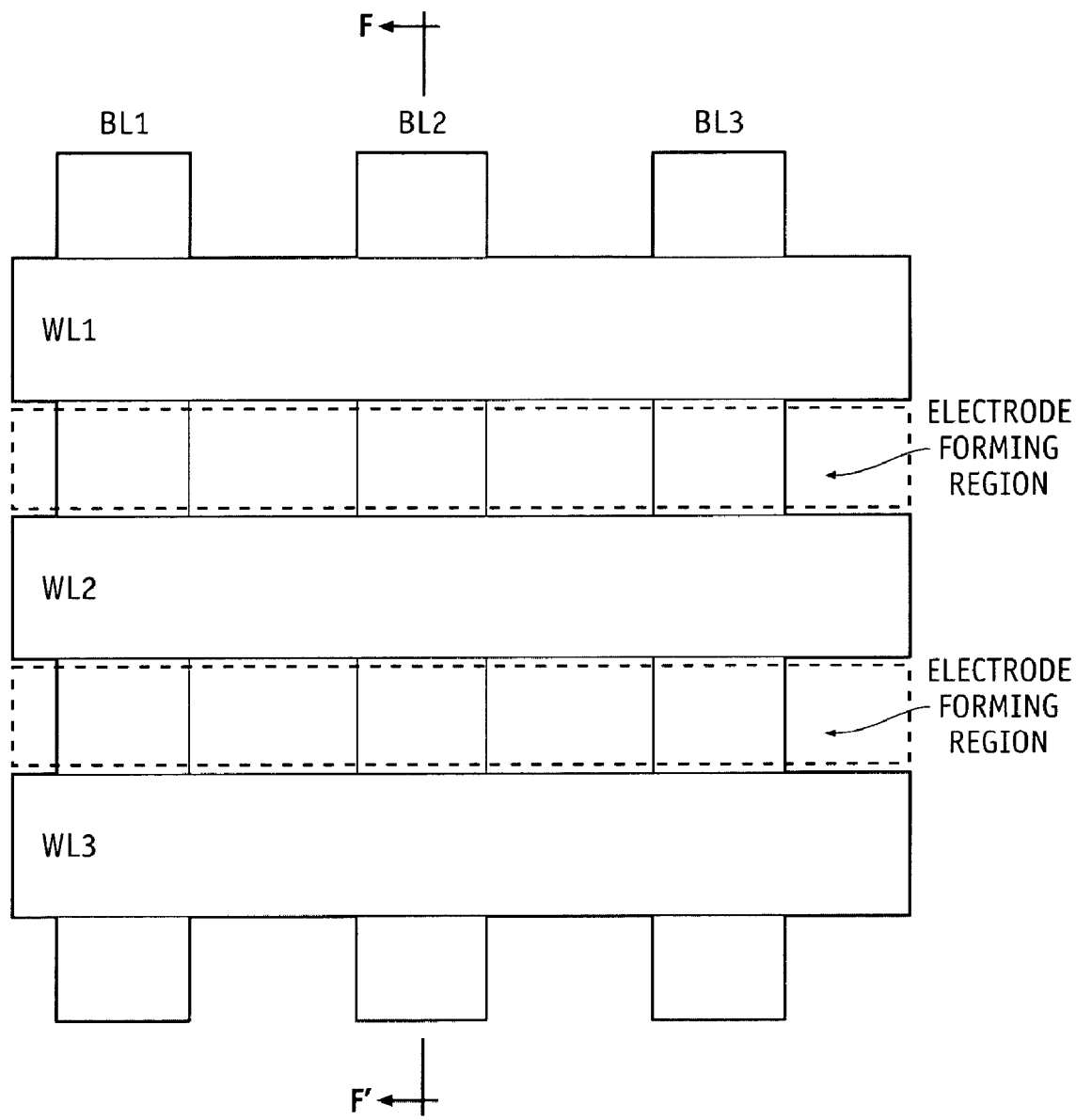
FIG. 17 is a schematic plan view during a step in the process for manufacturing a SONOS non-volatile memory in accordance with the second embodiment of the present invention.

After the above described series of procedures illustrated in FIGS. 15A through 15D, the layout illustrated in the schematic plan view of FIG. 17 is obtained and plug-like control electrodes are to be formed in the region indicated by the broken line in the drawing. In the following, the procedures for forming the plug-like control electrodes and the procedures following are described in conjunction with FIGS. 16A through 16D that are schematic cross-sectional views taken along the line F-F' of FIG. 17.

First, a photoresist 118 is formed to cover the area except for the core cell regions on which side gates are to be formed by a photolithography technique (FIG. 16A). So as to turn the silicon nitride film 113 into an etching stopper film, etching is performed on the portion of the oxide film 114 that is not covered with the photoresist 118 (FIG. 16B). The photoresist 118 that is now unnecessary is removed and side gate electrodes are formed on the bit lines that are not covered with the side walls 23 (FIG. 16C). The formation of the side gate electrodes may be carried out by forming a polysilicon film, a film made of a refractory metal such as tungsten, or a silicide film made of a refractory metal such as tungsten silicide having a thickness of approximately 200 nm on the entire substrate, and then performing etchback on the film.

An interlayer insulating film 115 such as a BPSG film having a thickness of approximately 1500 nm is further formed, and contact holes are then formed in the interlayer insulating film 115 by a photolithography technique and an etching technique. Following the contact hole formation, a laminated film 116 is provided. The laminated film 116 includes a barrier metal layer having a two-layer structure of a TiN film (15 nm in thickness) and a Ti film (40 nm in thickness), and a tungsten film (400 nm in thickness) formed through CVD on the barrier metal layer. After polishing is performed on the tungsten film by CMP, an Al line 117 is formed (FIG. 16D).

In the above described manner, a SONOS non-volatile memory having plug-like control electrodes in accordance with the present invention is obtained.

Write Operation

Next, the write operation of a SONOS non-volatile memory in accordance with the present invention is described.

FIGS. 18A and 18B illustrate the write operation of a SONOS non-volatile memory in accordance with the present invention. The left-side drawing in each of FIGS. 18A and 18B is a schematic plan view of two adjacent cells and their vicinity, and the right-side drawing is a schematic cross-sectional view of a single cell, taken along the line B-B' of each of FIGS. 18A and 18B.

FIG. 18A shows the state of a memory cell after erase is performed on all the bits. The threshold voltage $V_{th}$ of each memory cell is, for example, 1.5 V. A voltage $V_{sg}$ adjusted so as to deplete a portion of the surface of the silicon substrate that is half the width of a word line at the time of operation is applied to the plug-like control electrode 112 which is one of the two plug-like control electrodes provided on both sides of each single cell. For example, a voltage of approximately −4V is applied to the plug-like control electrode 112 and the other plug-like control electrode 111 is grounded to be 0V. As a voltage $V_g$ (2V, for example) that is equal to or higher than the threshold value is applied to the gate electrode, a channel is formed immediately below the word line WL1 on the opposite side from the plug-like control electrode 112 (the right-side drawing in FIG. 18A).

In this situation, the bit line 105 is grounded, and a voltage of 1V, for example, is applied to the bit line 106. Hot electrons generated in the vicinity of the bit line 106 are then accumulated in the silicon nitride film of the charge accumulation region 104. If the conditions for voltage application to the bit line 105 and the bit line 106 are reversed, charges can be accumulated in the silicon nitride film of the charge accumulation region 101.

In an opposite situation from the above, a voltage $V_{sg}$ of −4V is applied to the plug-like control electrode 111, and the plug-like control electrode 112 is grounded to be 0V, as shown in FIG. 18B. As a voltage $V_g$ of 2V is applied to the gate electrode, a channel is formed immediately below the word line WL1 on the opposite side from the plug-like control electrode 111 (the right-side drawing in FIG. 18B). In this situation, the bit line 105 is grounded, and a voltage of 1V, for example, is applied to the bit line 106. As a result, hot electrons generated in the vicinity of the bit line 106 are accumulated in the silicon nitride film of the charge accumulation region 103. If the conditions for voltage application to the bit line 105 and the bit line 106 are reversed, charges can be accumulated in the silicon nitride film of the charge accumulation region 102.

Figure 19:
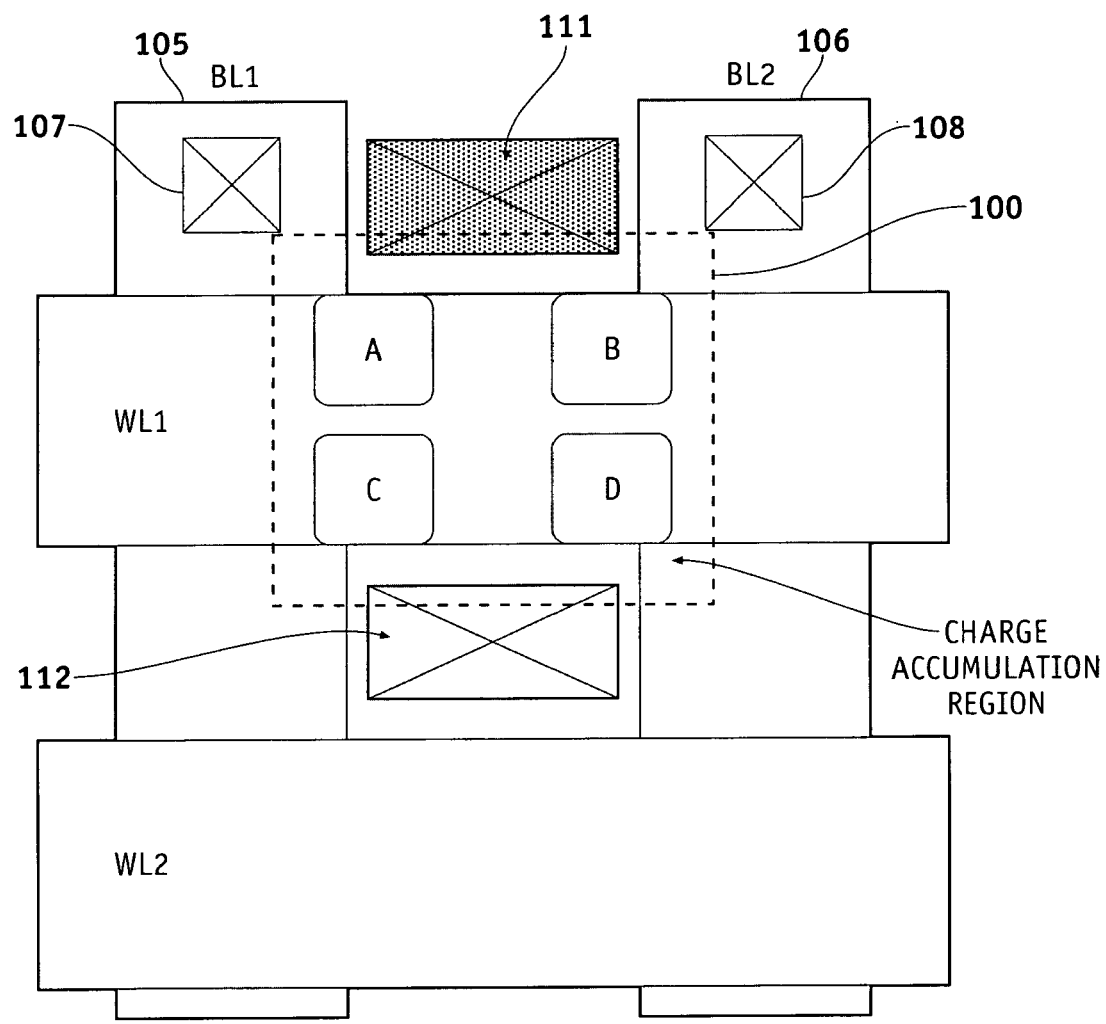
FIG. 19 illustrates the write operation and the read operation of a SONOS non-volatile memory in accordance with an embodiment of the present invention.
Figure 20:
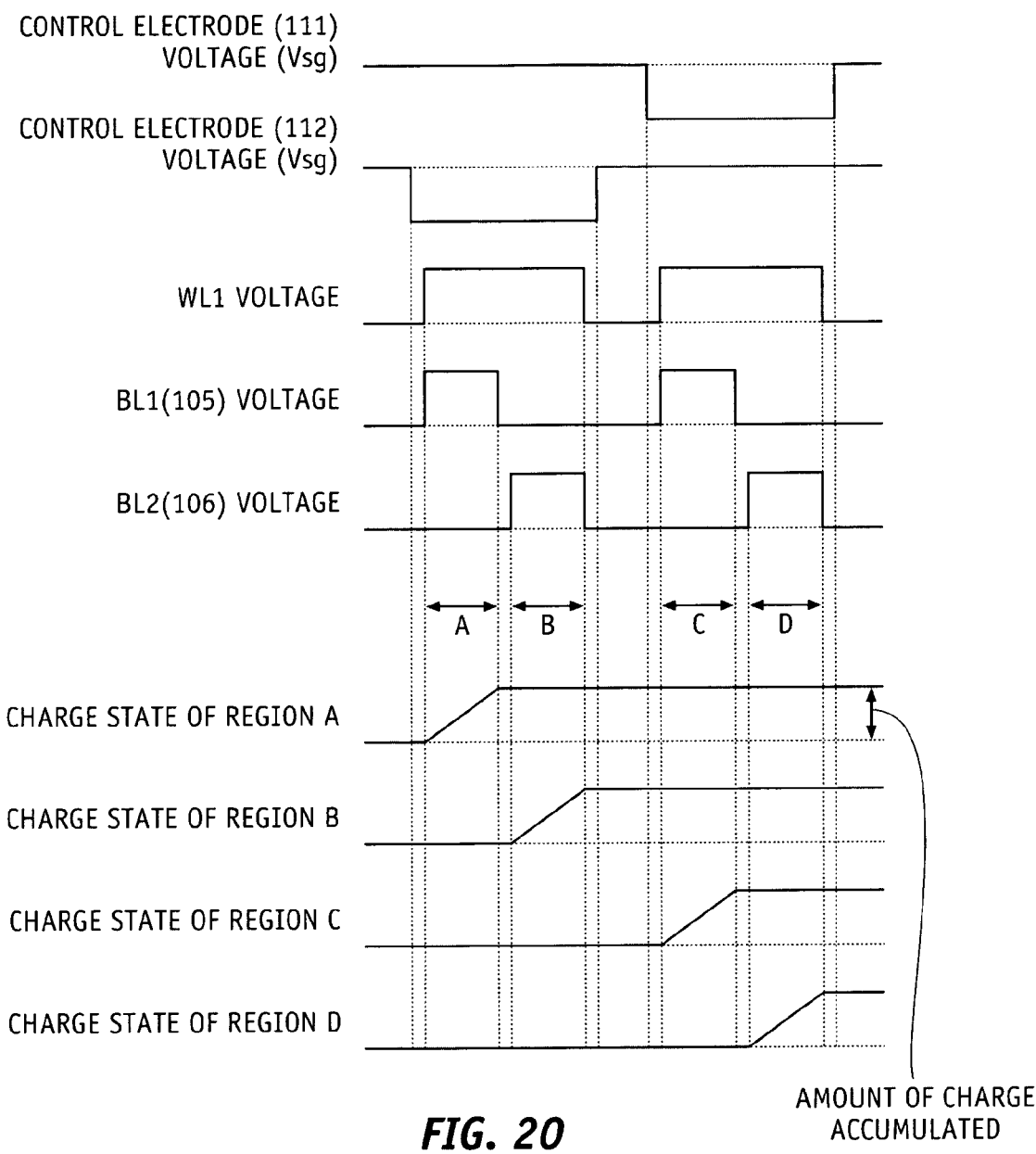
FIG. 20 illustrates the control voltages and the charge holding states of the charge accumulation regions at the time of writing in accordance with an embodiment of the present invention.

FIG. 20 is a timing chart of a write operation to be performed sequentially in the charge accumulation regions A, B, C, and D of a single cell 100 shown in FIG. 19.

First, a voltage $V_{sg}$ of −4V, for example, is applied to the plug-like control electrode 112 and the plug-like control electrode 111 is grounded to be 0V. A bias of a voltage $V_g$ (2V, for example) that is equal to or higher than the threshold value is applied to the gate electrode. In this situation, the word line WL1 is selected, and the bit line 106 is grounded. A voltage of 1V, for example, is applied to the bit line 105. As a result, charges are accumulated in the region A. While the electric conditions of the plug-like control electrodes 111 and 112, the gate electrode, and the word line WL1 remain the same, a voltage of 1V is applied to the bit line 106, and the bit line 105 is grounded. As a result, charges are accumulated in the region B.

Next, a voltage $V_{sg}$ of −4V, for example, is applied to the plug-like control electrode 111, and the plug-like control electrode 112 is grounded to be 0V. A bias of a voltage $V_g$ (2V, for example) that is equal to or higher than the threshold value is applied to the gate electrode. In this situation, the word line WL1 is selected, and the bit line 106 is grounded. A voltage of 1V, for example, is applied to the bit line 105. As a result, charges are accumulated in the region C. While the electric conditions of the plug-like control electrodes 111 and 112, the gate electrode, and the word line WL1 remain the same, a voltage of 1V is applied to the bit line 106, and the bit line 105 is grounded. As a result, charges are accumulated in the region D.

Read Operation

Next, the read operation of a SONOS non-volatile memory in accordance with the present invention is described.

Figure 21A:
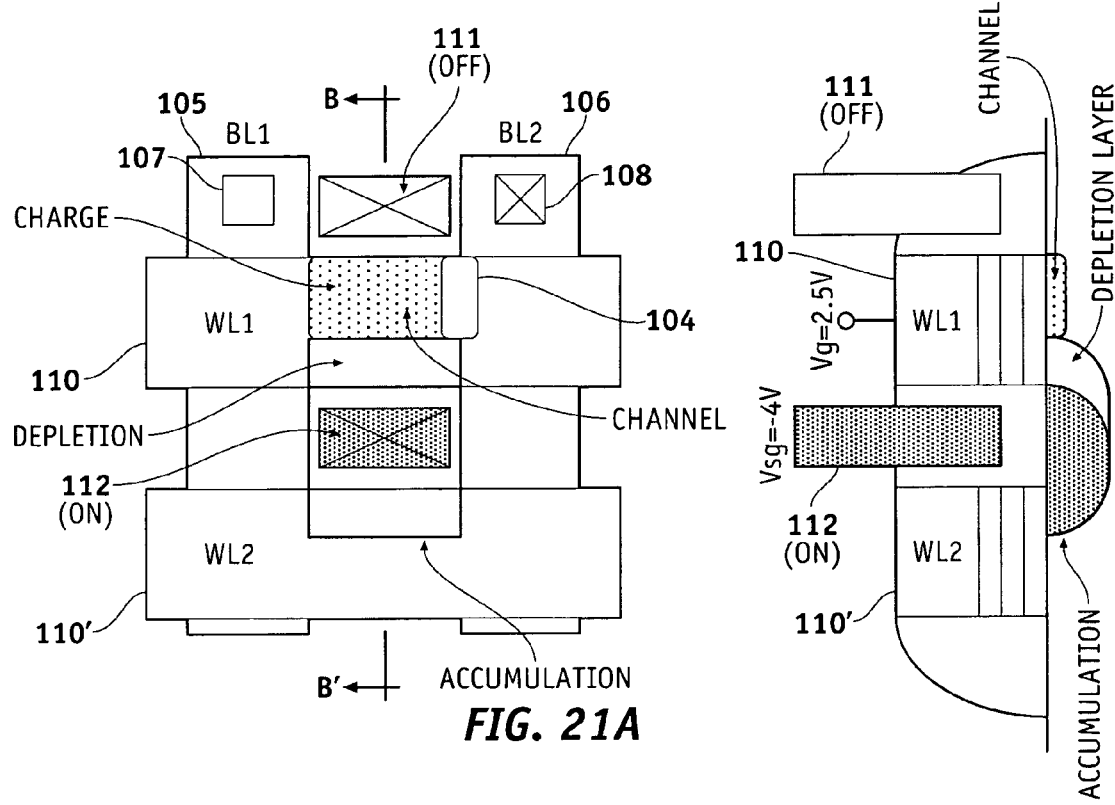
FIGS. 21A and 21B illustrate the read operation of a SONOS non-volatile memory in accordance with an embodiment of the present invention: each left side drawing is a schematic plan view of two adjacent cells and their vicinity area; and each right-side drawing is a schematic cross-sectional view of a single cell, taken along the line B-B' of each left-side drawing.
Figure 21B:
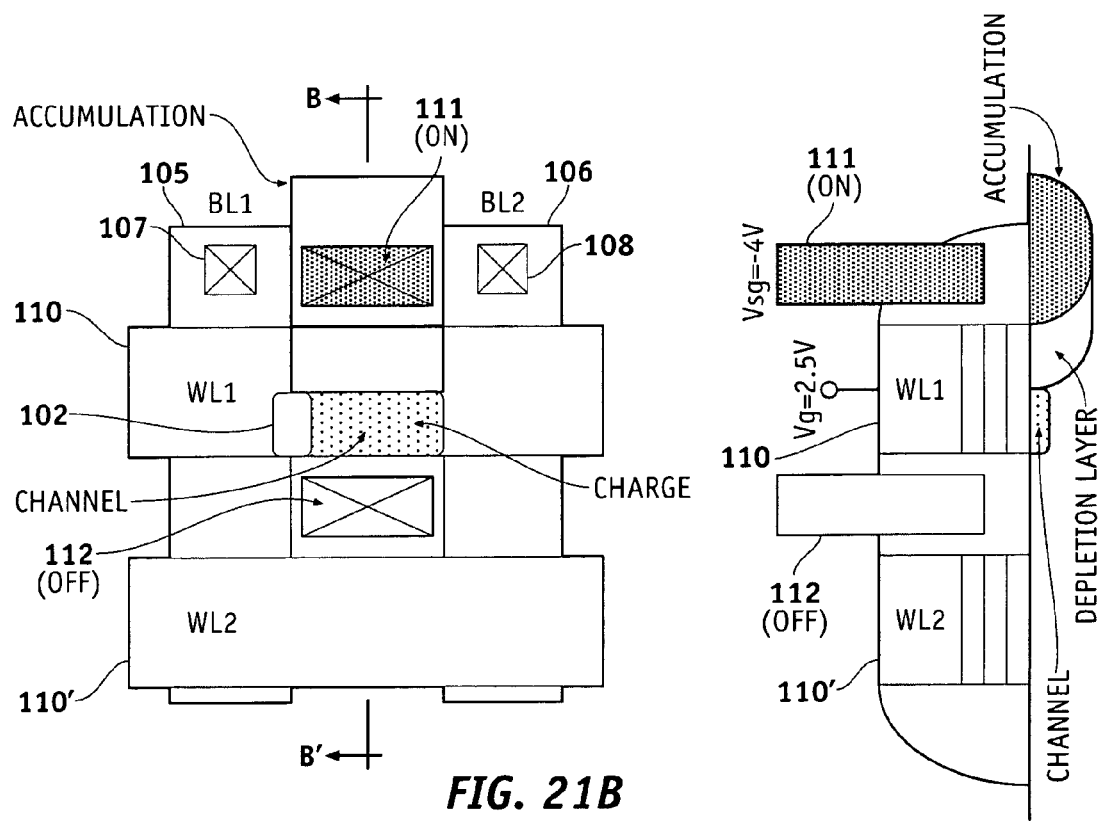

FIGS. 21A and 21B illustrate the read operation of a SONOS non-volatile memory in accordance with the present invention. The left-side drawing in each of FIGS. 21A and 21B is a schematic plan view of two adjacent cells and their vicinity area, and the right-side drawing is a schematic cross-sectional view of a single cell, taken along the line B-B' of each of FIGS. 21A and 21B. Here, the threshold voltage $V_{th}$ of each memory cell at the time of erasing is, for example, 1.5 V, and the threshold voltage $V_{th}$' after writing is, for example, 2.0 V. A voltage $V_{sg}$ (−4V, for example) adjusted so as to deplete a portion of the surface of the silicon substrate that is half the width of each word line at the time of operation is applied to the plug-like control electrode 112. Meanwhile, the other plug-like control electrode 111 is grounded to be 0V. As a voltage $V_g$ of 2.5V, for example, is applied to the gate electrode, a channel is formed immediately below the word line WL1 on the opposite side from the plug-like control electrode 112 (FIG. 21A).

In this situation, the bit line 106 is grounded, and a voltage of 0.5V, for example, is applied to the bit line 105. If charges are accumulated in the silicon nitride film in the vicinity of the bit line 106, a very low drain current $I_{ds}$ is obtained. When the conditions for voltage application to the bit line 105 and the bit line 106 are reversed, a desired drain current Ids can be obtained if charges are not accumulated in the silicon nitride film in the vicinity of the bit line 105. By virtue of the difference in drain current, the charge holding state in the vicinity of the plug-like control electrode 111 can be read.

A voltage $V_{sg}$ of −4V is then applied to the plug-like control electrode 111 and the plug-like control electrode 112 is grounded to be 0V. A voltage $V_g$ of 2.5V is applied to the gate electrode. A channel is then formed immediately below the word line WL1 on the opposite side from the plug-like control electrode 111. A read operation is then performed in the same manner as above so that the charge holding state in the vicinity of the plug-like control electrode 112 can be read (FIG. 21B).

Figure 22:
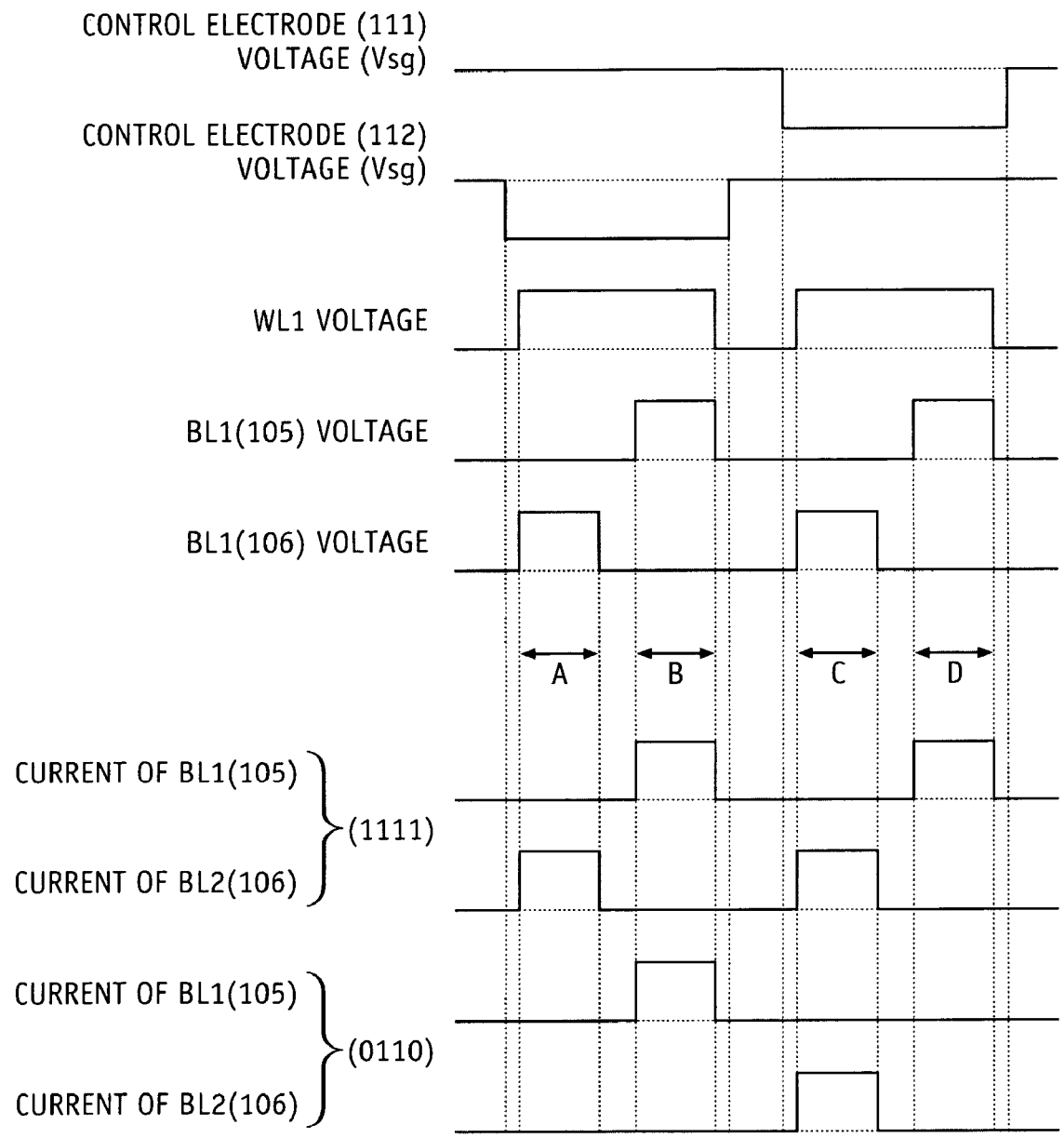
FIG. 22 shows the control voltages and the drain current flowing from the charge accumulation regions at the time of reading in accordance with an embodiment of the present invention.

FIG. 22 is a timing chart of a read operation to be performed sequentially in the charge accumulation regions A, B, C, and D of the single cell 100 shown in FIG. 19.

First, a voltage $V_{sg}$ of –4V, for example, is applied to the plug-like control electrode 112 and the plug-like control electrode 111 is grounded to be 0V. A bias of a voltage $V_g$ (2.5V, for example) that is equal to or higher than the threshold voltage value is applied to the gate electrode. In this situation, the word line WL1 is selected and the bit line 105 is grounded. A voltage of 0.5V, for example, is applied to the bit line 106. By doing so, the state of the region A can be read. The bit line 106 is then grounded and a voltage of 0.5V is applied to the bit line 105. By doing so, the charges accumulated in the region B can be read. Here, a very low drain current $I_{ds}$ is obtained from the charge accumulation region in which charges are accumulated, and the desired drain current $I_{ds}$ is obtained from the charge accumulation region in which charges are not accumulated. FIG. 22 shows the drain current $I_{ds}$ obtained in the case (1111) where charges are not accumulated in any of the charge accumulation regions A, B, C, and D, and the drain current $I_{ds}$ obtained in the case (0110) where charges are accumulated in the regions A and D.

Likewise, to read the region C, a voltage $V_{sg}$ of –4V, for example, is applied to the plug-like control electrode 111 and the plug-like control electrode 112 is grounded to be 0V. A bias of a voltage $V_g$ (2.5V, for example) that is equal to or higher than the threshold value is applied to the gate electrode. In this situation, the word line WL1 is selected, and the bit line 105 is grounded. A voltage of 0.5V, for example, is applied to the bit line 106. By doing so, the state of the region C can be read. The bit line 106 is then grounded and a voltage of 0.5V is applied to the bit line 105. By doing so, the state of the region D can be read.

As described so far, the present invention can provide a multi-value cell technique that increases the storage capacity per unit cell to four times as large (four bits per cell) as the storage capacity of a conventional cell without an increase in cell area.

Figure 23:
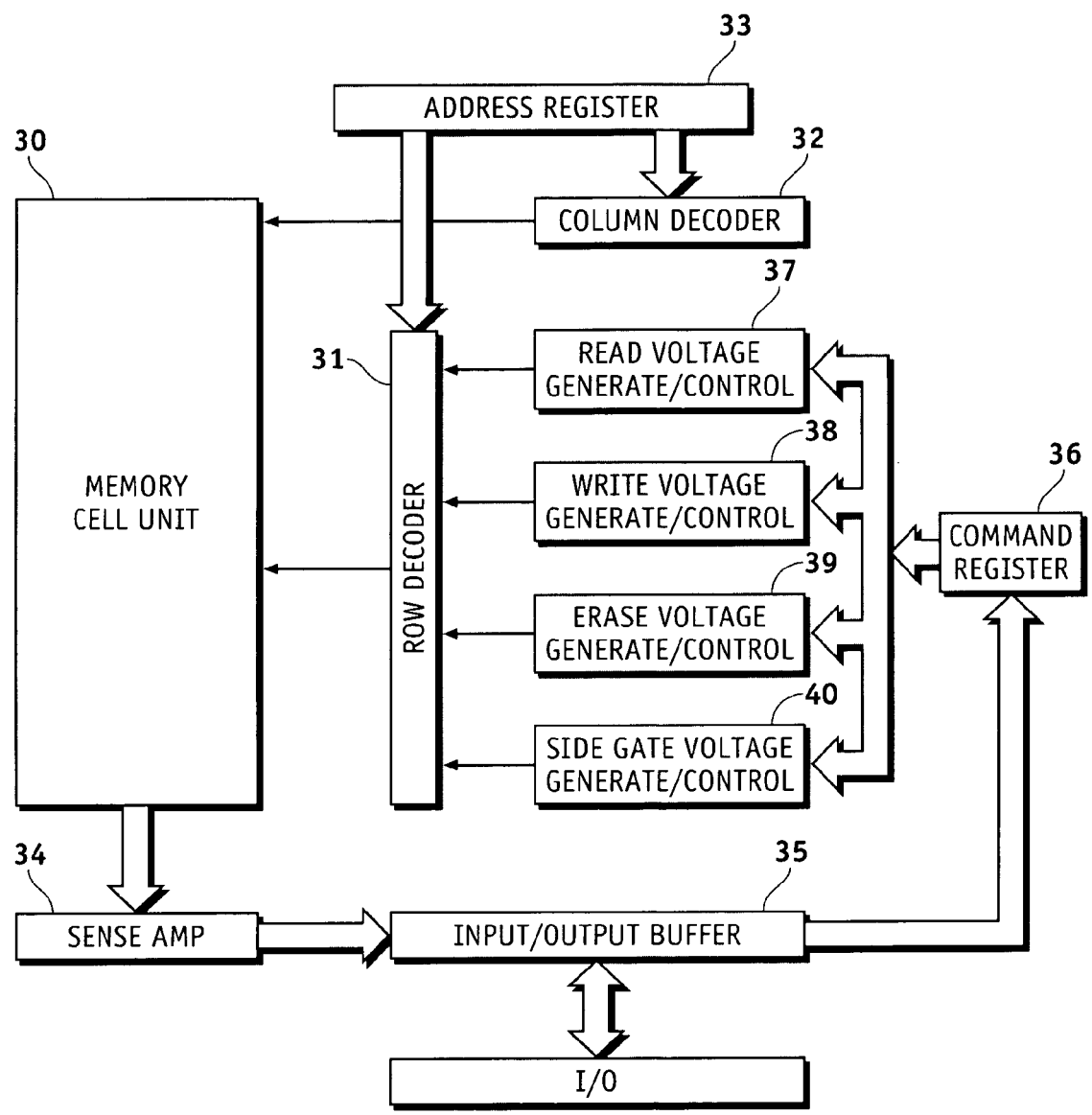
FIG. 23 is a block diagram of a SONOS non-volatile memory in accordance with an embodiment of the present invention.

FIG. 23 illustrates a circuit structure that performs data write and read operations on a SONOS non-volatile memory in accordance with the present invention. In a memory cell unit 30, a number of four-bit unit cells that are the same as those described above are arranged at intervals in a matrix fashion. A row decoder 31, a column decoder 32, a sense amplifier 34, an address register 33, an input/output buffer 35, a read voltage generating/controlling circuit 37, a write voltage generating/controlling circuit 38, an erase voltage generating/controlling circuit 39, a side gate voltage generating/controlling circuit 40, and a command register 36 are provided around the memory cell unit 30.

Figure 24A:
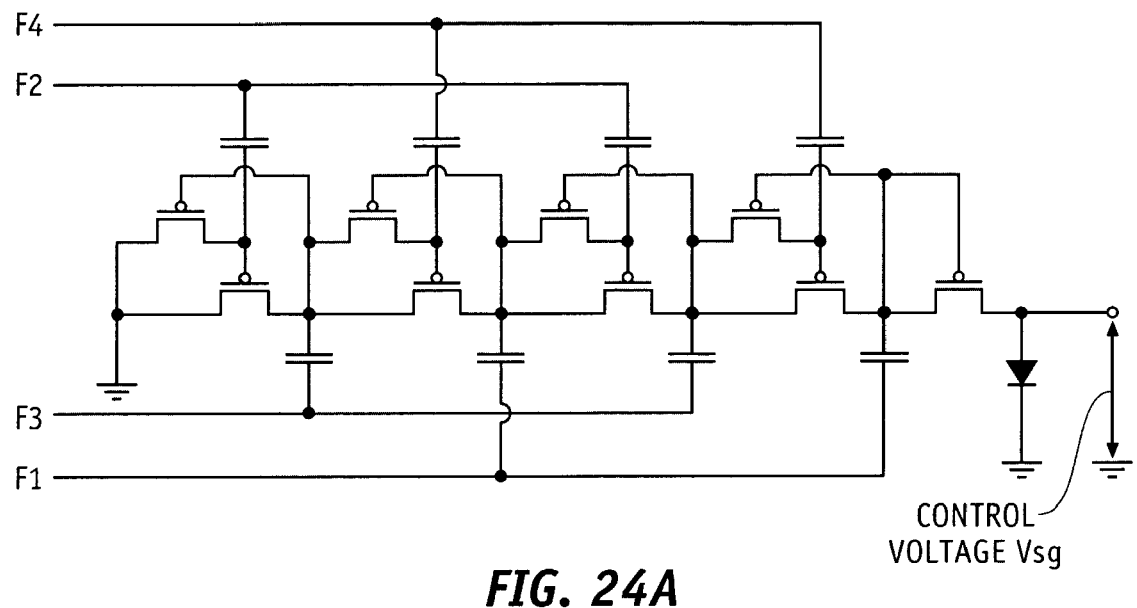
FIGS. 24A and 24B illustrate the detailed structure of the side gate voltage generating/controlling circuit in accordance with an embodiment of the present invention.
Figure 24B:
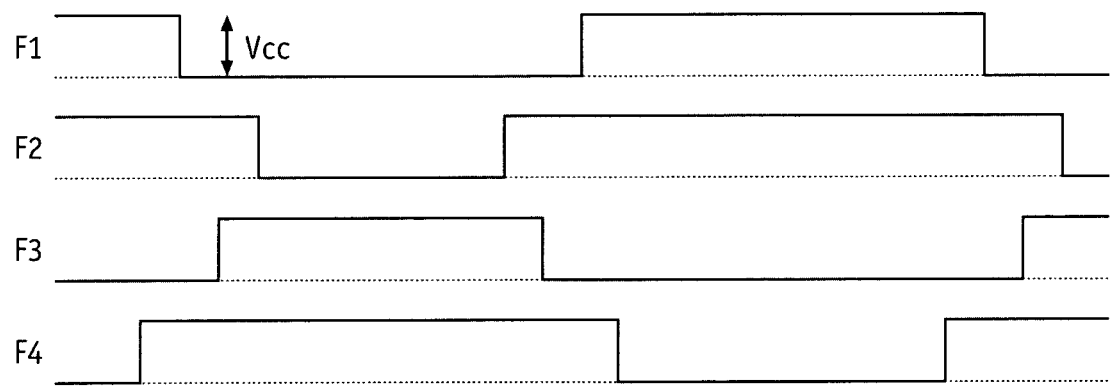

Commands that are input from the outside are accumulated in the 30 command register 36 and the voltage generating/controlling circuits 37 through 40 are activated in accordance with each input command. The address of each memory cell for which write, read, or erase is to be performed is supplied from the address register 33 to the column decoder 32 and the row decoder 31. The row decoder 31 and the column decoder 32 identify the address, and data write, read, or erase is then performed. FIG. 24A illustrates the structure of the side gate voltage generating circuit 40, which is the circuit that supplies a voltage $V_{sg}$ to the plug-like control electrodes 111 and 112. Voltages F1, F2, F3, and F4 are supplied to the circuit illustrated in FIG. 24A in accordance with the timing shown in FIG. 24B, thereby generating a negative voltage $V_{sg}$.

Although preferred embodiments of the present invention have been described so far, the present invention is not limited to these specific examples and various changes and modifications may be made to them without departing from the scope of the present invention as set forth in the claims appended hereto and their equivalents.

What is claimed is:

1. A non-volatile memory comprising:
   a gate insulating film that includes an ONO film having a first oxide film, a nitride film, and a second oxide film stacked in this order on a semiconductor substrate; and
   control electrodes that are provided on both sides of a gate electrode of each memory cell, wherein a channel region formed between the control electrodes has a channel width less than half of a width of the gate electrode.

2. The non-volatile memory as claimed in claim 1, wherein each memory cell has four charge accumulation regions located below the gate electrode, and the four charge accumulation regions are arranged in rows and columns.

3. The non-volatile memory as claimed in claim 2, wherein the memory cells are arrayed in a first direction and a second direction, the non-volatile memory further comprising word lines and bit lines running in the first direction and the second direction respectively, wherein the word lines provide gate electrodes of the memory cells aligned in the first direction and the bit lines provide sources and drains of the memory cells aligned in the second direction.

4. A non-volatile memory comprising:
   a gate insulating film that includes an ONO film having a first oxide film, a nitride film, and a second oxide film stacked in this order on a semiconductor substrate; and
   control electrodes that are provided on both sides of a gate electrode of each memory cell, wherein the memory cells are arrayed in a first direction and a second direction, the non-volatile memory further comprising word lines and bit lines running in the first direction and the second direction respectively, wherein the word lines provide the gate electrodes of the memory cells aligned in the first direction and the bit lines provide sources and drains of the memory cells aligned in the second direction, wherein the bit lines are embedded in the semiconductor substrate.

5. The non-volatile memory as claimed in claim 4, wherein each of the control electrodes is provided in a region defined by two adjacent word lines and two adjacent bit lines.

6. The non-volatile memory as claimed in claim 4, wherein the control electrodes are arranged in rows and columns.

7. The non-volatile memory as claimed in claim 1, wherein the gate electrode and the control electrodes are supplied with such voltages that the channel width becomes less than half the width of the gate electrode.

8. The non-volatile memory as claimed in claim 1, wherein:
   the gate electrode is supplied with a voltage equal to or higher than a threshold voltage so that a region in the semiconductor substrate located below the gate insulating film serves as the channel region;
   one of the control electrodes is supplied with a control voltage so that a region in the semiconductor substrate in the vicinity of said one of the control electrodes is an accumulation region; and
   a depletion region formed in the semiconductor substrate and located between the accumulation region and the channel region defines the channel width.

9. The non-volatile memory as claimed in claim 8, wherein conditions for biasing the sources and drains are alternately switched so that write and read operations are performed.

10. The non-volatile memory as claimed in claim 1, wherein the gate electrodes are made of polysilicon.

11. The non-volatile memory as claimed in claim 1, wherein:
the semiconductor substrate is of a P-conduction type; and
the gate electrode receives a positive bias voltage, and the control electrodes receive negative bias voltages.

12. The non-volatile memory as claimed in claim 1, wherein:
the semiconductor substrate is of an N-conduction type; and
the gate electrode receives a negative bias voltage, and the control electrodes receive positive bias voltages.

13. A method for controlling a non-volatile memory having an ONO film on a semiconductor substrate, the method comprising the steps of:
applying a voltage to a gate electrode that is shared among memory cells; and
applying another voltage to one of two control electrodes between which the gate electrode is interposed,
wherein four charge accumulation regions are formed in a nitride film of the ONO film in a region that is located below the gate electrode and is interposed between the two control electrodes.

14. The method as claimed in claim 13, wherein:
the step of applying a voltage to the gate electrode includes applying a positive voltage to the gate electrode; and
the step of applying another voltage to one of the two control electrodes includes applying a negative voltage to said one of the two control electrodes.

15. The method as claimed in claim 13, wherein:
the step of applying a voltage to the gate electrode includes applying a negative voltage to the gate electrode; and
the step of applying another voltage to one of the two control electrodes includes applying a positive voltage to said one of the two control electrodes.

16. The non-volatile memory as claimed in claim 1, wherein each of the control electrodes is provided in a region defined by two adjacent word lines and two adjacent bit lines.

17. The non-volatile memory as claimed in claim 1, wherein the control electrodes are arranged in rows and columns.

18. The non-volatile memory as claimed in claim 1, wherein a charge accumulation region in the nitride film interposed between the control electrodes is operatively divided into four parts.

* * * * *